United States Patent [19]

Zook

[11] Patent Number: 5,446,743
[45] Date of Patent: Aug. 29, 1995

[54] COEFFICIENT UPDATING METHOD AND APPARATUS FOR REED-SOLOMON DECODER

[75] Inventor: Christopher P. Zook, Longmont, Colo.

[73] Assignee: Cirrus Logic, Inc., Fremont, Calif.

[21] Appl. No.: 326,164

[22] Filed: Oct. 18, 1994

Related U.S. Application Data

[63] Continuation of Ser. No. 147,650, Nov. 4, 1993.

[51] Int. Cl.[6] .................. G06F 11/10; H03M 13/00
[52] U.S. Cl. ...................................... 371/371; 371/375
[58] Field of Search ............... 371/37.1, 37.5, 37.2, 371/37.3, 37.4, 37.7

[56] References Cited

U.S. PATENT DOCUMENTS

| | | | |
|---|---|---|---|
| 4,777,635 | 10/1988 | Glover | 371/37.5 |
| 4,782,490 | 11/1988 | Tenengolts | 371/37.5 |
| 4,845,713 | 7/1989 | Zook | 371/37.1 |

OTHER PUBLICATIONS

Youzhi, "Implementation of Berelekamp-Massey algorithm without inversion", IEEE Proceedings-I, vol. 138, No. 3, Jun. 1991.
Reed et al. "VLSI design or inverse-free Berlekamp-Massey algorithm," IEEE Proceedings-E, vol. 138, No. 5, Sep. 1991.

Primary Examiner—Roy N. Envall, Jr.
Assistant Examiner—Emmanuel Moise
Attorney, Agent, or Firm—Nixon & Vanderhye

[57] ABSTRACT

A Reed-Solomon decoder (199) processes a codeword containing n m-bit symbols to determine coefficients of an error locator polynomial $\sigma(x)$, and thereafter generates an error evaluator polynomial $\omega(x)$. The decoder comprises a bank (B103) of syndrome registers (103) for storing syndrome values; a bank (B101) of error locator registers (101) for accumulating therein coefficients of an error locator polynomial $\sigma(x)$; and, a bank (B102) of intermediate registers (102) for accumulating therein coefficients of an intermediate polynomial $\tau(x)$. The decoder (199) further includes a register update circuit (50) which, for a given codeword, conducts two-phased error locator iterations in order to update values in the error locator registers and the intermediate registers. In contrast to prior art techniques, the register update circuit (50) of the present invention updates coefficients of the intermediate polynomial $\tau(x)$ during the first phase of each error locator iteration, and updates coefficients of the error locator polynomial $\sigma(x)$ during the second phase of each error locator iteration. In further contrast, the decoder (199) of the present invention requires only one bank of error locator registers (101) and one bank of intermediate registers (102) and facilitates serial data shifting rather than parallel data transfer, thereby reducing circuit real estate.

37 Claims, 12 Drawing Sheets

COEFFICIENT UPDATING METHOD AND APPARATUS FOR REED-SOLOMON DECODER

CROSS-REFERENCE TO RELATED APPLICATIONS

This patent application is a continuation application of U.S. patent application Ser. No. 08/147,650, filed Nov. 4, 1993, which is incorporated herein by reference. Patent applications filed concurrently (inventor: Christopher P. Zook) with this patent application and incorporated herein by reference include U.S. patent application Ser. No. 08/325,717 entitled "CYCLIC REDUNDANCY CHECK METHOD AND APPARATUS", U.S. patent application Ser. No. 08/325,850 entitled "BURST ERROR CORRECTOR", U.S. patent application Ser. No. 08/325,831 entitled "FINITE FIELD INVERSION", and U.S. patent application Ser. No. 08/326,126 entitled "ERROR CORRECTION METHOD AND APPARATUS", Patent applications filed concurrently with U.S. patent application Ser. No. 08/147,650 (and all hereby incorporated herein by reference) include U.S. patent application Ser. No. 08/147,865 entitled "DUAL PURPOSE CYCLIC REDUNDANCY CHECK", U.S. patent application Ser. No. 08/148,068 entitled "BURST ERROR CORRECTOR", and U.S. patent application Ser. No. 08/147,758 entitled "FINITE FIELD INVERSION".

BACKGROUND

1. Field of Invention

This invention relates generally to digital data communication systems, particularly to the encoding and decoding of error correcting codes.

3. Related Art and Other Considerations

In a digital data communication system (including storage and retrieval from optical or magnetic media), error control systems are typically employed to increase the transfer rate of information and at the same time make the error rate arbitrarily low. For fixed signal-to-noise ratios and fixed bandwidths improvements can be made through the use of error-correcting codes.

With error-correction coding, the data to be transmitted or stored is processed to obtain additional data symbols (called check symbols or redundancy symbols). The data and check symbols together make up a codeword. After transmission or retrieval, the codeword is mathematically processed to obtain error syndromes which contain information about locations and values of errors.

The Reed-Solomon codes are a class of multiple-error correcting codes. One of the most popular methods of decoding is to generate the error locator polynomial $\sigma(x)$ [i.e the connection polynomial using the Berlekamp-Massey algorithm]; generate the error evaluator polynomial $\omega(x)$ from the error locator polynomial; perform a root search for the error locator polynomial to detect error locations; and then evaluate the error evaluator polynomial at the error locator polynomial root to calculate an error value.

Most logic circuits for error detection and correction implement the Berlekamp-Massey algorithm. Each iteration of the Berlekamp-Massey algorithm has two parts or stages:

1) calculate $d_n$:    $d_n = \Sigma \sigma_k S_{n-k}$ 2) update $\sigma$:    $\sigma^{(n+1)}(x) = \sigma^{(n)}(x) - d_n d_r^{-1} x \tau^{(n)}(x)$ update $\tau$:    $\tau^{(n+1)}(x) = x\tau^{(n)}(x)$ or $\sigma^{(n)}(x)$ As used herein, $d_n$ is a discrepancy number and $\tau$ is an intermediate polynomial used in calculating $\sigma$. The choice of the two alternate expressions for $\tau$ depends on whether or not the $\sigma(x)$ update results in an increase in the order of $\sigma(x)$. When an increase results, $\tau(x)$ is set to $\sigma(x)$ and $d_r$ is set to $d_n$. If $\tau(x)$ is instead set to $d_n^{-1} x \sigma(x)$ then $d_r$ can be eliminated and the recursions become:

EQUATIONS. 1:

1) calculate $d_n$:    $d_n = \Sigma \sigma_k S_{n-k}$ 2) update $\sigma$:    $\sigma^{(n+1)}(x) = \sigma^{(n)}(x) - d_n \tau^{(n)}(x)$ update $\tau$:    $\tau^{(n+1)}(x) = x\tau^{(n)}(x)$ or $\tau^{(n+1)}(x) = d_n^{-1} x \sigma^{(n)}(x)$ and $d_r = d_n$ The second stage requires the result of the first stage. To minimize circuitry size it is desirable to perform all arithmetic in a serial manner and to make updates in a serial manner (as opposed to a parallel manner requiring space-consuming parallel buses). Assuming the field used is $GF(2^m)$, the minimum number of clock cycles needed for a serialized implementation is 2m clocks per iteration, i.e. m clocks per stage.

U.S. Pat. No. 4,845,713, issued Jul. 4, 1989 to Zook, shows a method which uses 2m+1 clocks per iteration and bit-serial multipliers and adders. However it uses 4t+1 m-bit registers and a $2^m \times m$ ROM look-up table for inversion (t being the number of correctable errors). Also, the update for $\tau^{(n+1)}(x)$ is done in a parallel manner.

Various decoding methods are described in Whiting's PhD dissertation for the California Institute of Technology entitled "Bit-Serial Reed-Solomon Decoders in VLSI," 1984. Whiting's preferred implementation uses the following modified set of recursion equations:

EQUATIONS 2:

1) calculate $d_n$:    $d_n = \Sigma \sigma_k S_{n-k}$ 2) update $\sigma$:    $\sigma^{(n+1)}(x) = \sigma^{(n)}(x)$ or $\sigma^{(n+1)}(x) = d_n^{-1} \sigma^{(n)}(x) - x\tau^{(n)}(x)$ update $\tau$:    $\tau^{(n+1)}(x) = x\tau^{(n)}(x)$ or $\tau^{(n+1)}(x) = d_n^{-1} \sigma^{(n)}(x)$ Whiting's implementation can perform an iteration in 2m clocks if a $2^m \times m$ ROM look-up table is used for inversion. The updates can be done serially, but $d_n^{-1}$ must be parallel bussed to each multiplier. Whiting's overall implementation would use 5(t+1) m-bit registers. The reason that the number of registers is proportional to t+1 instead of t is because $\sigma_0$ is not identically equal to 1, i.e. the $\sigma(x)$ generated by EQUATIONS 2 is the $\sigma(x)$ generated by EQUATIONS 1 multiplied by some constant. Whiting also mentions using the following modified set of recursion equations:

EQUATIONS 2A:

-continued 1) calculate $d_n$: $\quad d_n = \Sigma \sigma_k S_{n-k}$ 2) update $\sigma$: $\quad \sigma^{(n+1)}(x) = d_r \sigma^{(n)}(x) - x d_n \tau^{(n)}(x)$ update $\tau$: $\quad \tau^{(n+1)}(x) = x\tau^{(n)}(x)$ or $\quad\quad\quad\quad\quad \tau^{(n+1)}(x) = \sigma^{(n)}(x)$ Whiting's second method uses no inversions, but for serial updates it requires $6(t+1)+2$ m-bit registers and $d_n$ and $d_r$ must be parallel bussed to each multiplier.

All known implementations for the Berlekamp-Massey algorithm use some combination of a $2^m \times m$ ROM, symbol-wide signal paths, and an excessive number of m-bit registers in order to perform an iteration in 2m clock cycles. An inherent problem with all of the above sets of iteration equations is that $\sigma^{(n+1)}(x)$ depends on $\tau^{(n)}(x)$ and, in turn, $\tau^{(n+1)}(x)$ depends on $\sigma^{(n)}(x)$. Since one or both of them depend upon $d_n$, consequentially $d_n$ must be calculated during the first m clock cycles and then $\sigma^{(n+1)}(x)$ and $\tau^{(n+1)}(x)$ must both be calculated during the second m clock cycles. This implies the need for temporary storage for one or both of $\sigma^{(n)}(x)$ and $\tau^{(n)}(x)$ when used in multiplications to produce $\sigma^{(n+1)}(x)$ or $\tau^{(n+1)}(x)$. Thus there is a need for a more efficient method.

SUMMARY

A Reed-Solomon decoder processes a codeword containing n m-bit symbols to determine coefficients of an error locator polynomial $\sigma(x)$, and thereafter generates an error evaluator polynomial $\omega(x)$. The decoder comprises a bank of syndrome registers for storing syndrome values; a bank of error locator registers for accumulating therein coefficients of an error locator polynomial $\sigma(x)$; a bank of intermediate registers for accumulating therein coefficients of an intermediate polynomial $\tau(x)$. The decoder further includes a register update circuit which, for a given codeword, conducts t number of error locator iterations in order to update values in the error locator registers and the intermediate registers. Each error locator iteration includes two phases, specifically a first phase or phase A and a second phase or phase B. Each phase comprises m clock cycles. Upon completion of the error locator iterations, two-phased error evaluator iterations are conducted to determine coefficients of the error evaluator polynomial $\omega(x)$ which are stored in the intermediate registers.

In contrast to prior art techniques wherein coefficients of the error locator polynomial $\sigma(x)$ and coefficients of the intermediate polynomial $\tau(x)$ are both updated during the same phase (e.g., the second phase of an error locator iteration), the register update circuit of the present invention updates coefficients of the intermediate polynomial $\tau(x)$ during the first phase of each error locator iteration, and updates coefficients of the error locator polynomial $\sigma(x)$ during the second phase of each error locator iteration. A current discrepancy value $d_n$, required for updating the coefficients of the error locator polynomial $\sigma(x)$, is also obtained during the first phase of each error locator iteration.

The decoder of the present invention thus implements the following recursion rules:

PHASE A: update $\tau$:

$\tau^{(n)}(x) = x\tau^{(n-1)}(x)$ or $\tau^{(n)}(x) = x(\tau^{(n-1)}(x) + d_{n-1}^{-1}\sigma^{(n)}(x))$ update $d_n$:

$d_n = \Sigma \sigma_k S_{n-k}$

PHASE B: update $\sigma$:

$\sigma(n+1)(x) = \sigma^{(n)}(x) - d_n \tau^{(n)}(x)$

The register update circuit includes a discrepancy determination circuit for determining, during the first phase of each error locator iteration, the current discrepancy $d_n$. The discrepancy determination circuit adds multiplicative products from a plurality of "slices" to obtain the current discrepancy $d_n$. Each slice comprises one of the syndrome registers, one of the error locator registers, one of the intermediate registers, and one modified syndrome register.

The multiplicative product of each slice is generated by a discrepancy-generating inner product generator circuit. The discrepancy-contributing inner product generator circuit of a slice takes the inner product of the modified syndrome register of the slice (in second or $\beta$ basis representation) and the contents of the intermediate register of the slice (in first or $\alpha$ basis representation). The product of two elements of $GF(2^m)$, where one element is represented in the standard or $\alpha$ basis and one element is represented in the dual or $\beta$ basis, can be produced serially, i.e. one output bit per clock, by taking the inner product of the two elements and multiplying one of the elements by $\alpha$ on each clock. Thus, in connection with the inner product generated by the discrepancy-contributing inner product generator circuit, the modified syndrome register initially receives the syndrome value of its corresponding syndrome register, but is updated to contain an $\alpha$-multiple of the syndrome value by virtue of a multiplier feedback circuit connected around each modified syndrome register. Thus, each multiplicative product (i.e., the multiplicative product produced by a slice) is derived from a first term (the coefficient of the error locator register of the slice) and a second term (an $\alpha$-multiple of the syndrome value of the slice [the $\alpha$-multiple being stored in the modified syndrome register]). These first and second terms are multiplied by the discrepancy-contributing inner product circuit included in the slice.

The register update circuit also includes a discrepancy inversion circuit which determines an inverse of the current discrepancy (i.e., $d_n{}^{-1}$) in first basis representation. This inverse becomes the inverse of a prior discrepancy (i.e., $d_{n-1}{}^{-1}$ in an immediately suceeding error locator iteration). The discrepancy inversion circuit does not utilize a ROM-stored look up table, but instead serially receives the discrepancy in the second basis representation and generates its inverse.

The register update circuit also includes a discrepancy register DM which selectively has stored therein the inverse of the prior discrepancy (i.e., $d_{n-1}{}^{-1}$) during the first phase of each error locator iteration and the current discrepancy ($d_n$) during the second phase of each error locator iteration. Both the inverse of the prior discrepancy (i.e., $d_{n-1}{}^{-1}$) and the current discrepancy ($d_n$) are stored in the discrepancy register in first basis (i.e., $\alpha$ basis) representation, the prior discrepancy (i.e., $d_{n-1}{}^{-1}$) having been generated in the first basis representation by the discrepancy inversion circuit and the current discrepancy ($d_n$) having been converted from second basis (i.e., $\beta$ basis) representation to first basis representation by a conversion circuit for converting $d_n$ from a second basis representation to a first basis representation.

The register update circuit also includes an updating multiplier or inner product circuit which, during the first phase of each error locator iteration, selectively multiplies a value derived from the inverse of the prior discrepancy ($d_{n-1}^{-1}$), e.g., an $\alpha$-multiple of $d_{n-1}^{-1}$ [stored in the discrepancy register during the first phase of the error locator iteration] by the coefficients in the error locator registers to obtain values for use in updating the coefficients stored in the intermediate registers. Thereafter (e.g., during the second phase of each error locator iteration), the updating multiplier circuit multiplies a value derived from the current discrepancy $d_n$, e.g., an $\alpha$-multiple of $d_n$ [stored in the discrepancy register during the second phase of the error locator iteration] by the coefficients in the intermediate registers to obtain values for updating the coefficients stored in the error locator registers. The $\alpha$-multiple of the current discrepancy $d_n$ is obtained by a multiplier feedback circuit connected to the discrepancy register for repetitively multiplying the value in the discrepancy register by the field element $\alpha$.

Importantly, in contrast to prior art techniques, the decoder of the present invention requires only one bank of error locator registers and one bank of intermediate registers. Prior art techniques of necessity included two banks of error locator registers: a first bank for maintaining the updated (new) coefficients of the error locator polynomial and a second bank for storing the old coefficients of the error locator polynomial (which were used to update the coefficients of the intermediate polynomial). Similarly, the prior art technique employed two banks of intermediate registers: a first bank for maintaining the new (updated) coefficients of the intermediate polynomial and a second bank for storing the old coefficients of the intermediate polynomial (which were used to update the coefficients of the error locator polynomial). Thus, the decoder of the present invention advantageously eliminates two banks of registers. In addition, the decoder of the present invention facilitates serial data shifting rather than parallel data transfer, thereby reducing circuit real estate which would otherwise be increased by parallel bus structure.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

DETAILED DESCRIPTION OF THE DRAWINGS

Figure 1:
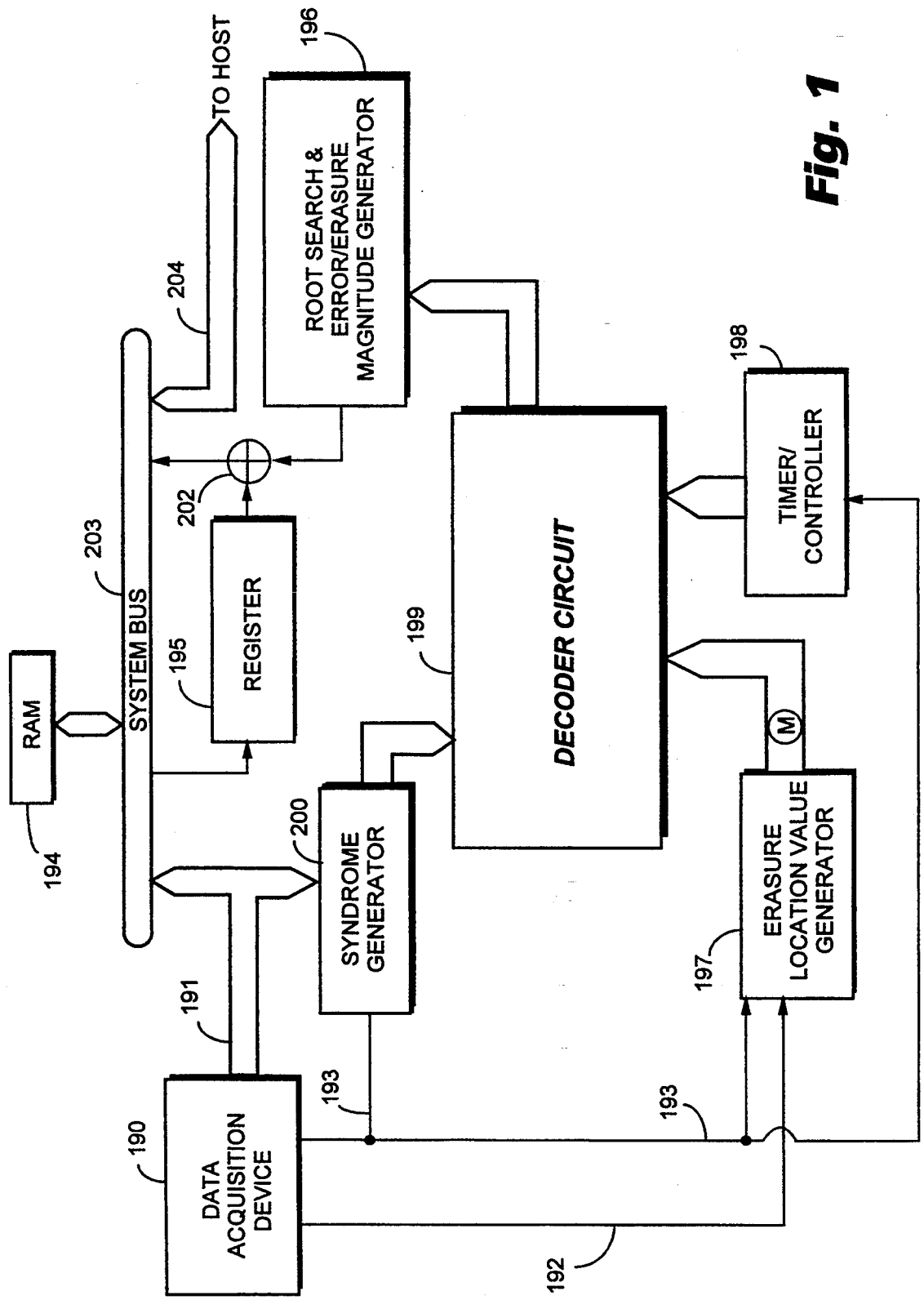
FIG. 1 is a schematic view generally showing a block diagram which depicts an error correction system according to an embodiment of the invention.

FIG. 1 schematically illustrated structure involved with the decoding of information according to an embodiment of the invention. FIG. 1 illustrates a data acquisition device 190 of a type which generates an m-bit data signal on input data bus 191; an erasure pointer signal on line 192; and, a codeword reset signal on line 193.

The error correction system of FIG. 1 comprises a buffer 194 (RAM); a one byte register 195; a root search and error/erasure magnitude generator 196; an erasure location value generator 197; a timer/controller 198; a decoder circuit 199; a syndrome generator 200; a data buffer 201; and, an adder 202. Data acquisition device 190 applies the m-bit data on bus 191 both to syndrome generator 200 and to a system bus 203. Data acquisition device 190 also communicates the codeword reset signal on line 193 to syndrome generator 200, erasure location value generator 197, and timer/controller 198. In addition, erasure location value generator 197 receives the erasure pointer signal on line 192.

System bus 203 is connected to buffer 194, to input data bus 191, to an input terminal of register 195, to an output terminal of adder 202, and to a host-connected output bus 204.

As more fully described in U.S. patent application Ser. No. 08/326,126 filed simultaneously herewith, entitled "("ERROR CORRECTION METHOD AND APPARATUS") and incorporated herein by reference, buffer 194 has stored therein a plurality of data blocks, each data block comprising a plurality of codewords. Three operations are executed in asynchronous manner, namely uncorrected data blocks from the acquisition device 190 fill buffer 194, uncorrected data blocks within buffer 194 are corrected by the invention herein described, and already corrected data blocks within buffer 194 are emptied to the host via output bus 204. These three operations may be executed simultaneously on different sectors in an asynchronously overlapped manner.

The invention described herein concerns the decoding of a codeword, and should not be construed to be limited to the particular buffering scheme illustrated herein. In connection with decoding of a codeword, decoder circuit 199 receives t m-bit syndromes from syndrome generator 200 and m-bit erasure location values from erasure location value generator 197. In addition, the operation of decoder circuit 199 is sequenced by signals applied thereto by timer/controller 198. After a series of error locator iterations, decoder circuit 199 obtains final values for the t m-bit coefficients of the error locator polynomial $\sigma$. Upon completion of the series of error locator iterations for a codeword, decoder circuit 199 executes a series of error magnitude iterations to generate an error evaluator polynomial $\omega$ for the codeword. The coefficients of the error evaluator polynomial $\omega$ are transmitted to the root search and error/erasure magnitude generator 196 where the error magnitude E is calculated. After calculation of the error magnitude E, the error magnitude E is added to the original data at adder 202, resulting in the corrected byte. In the buffering scheme herein illustrated, the corrected byte is then returned to buffer 194.

The product of two elements of $GF(2^m)$, where one element is represented in the standard or $\alpha$ basis and one element is represented in the dual or $\beta$ basis, can be produced serially, i.e. one output bit per clock, by taking the inner product of the two elements and multiplying one of the elements by $\alpha$ on each clock. Accordingly, as used herein, such values as the syndromes, the current discrepancy $d_n$, and the prior discrepancy $d_{n-1}$ are represented in the $\alpha$ basis while such values as the coefficients of $\sigma(x)$ and $\tau(x)$ are represented in the $\beta$ basis. Such representation allows all of the multiplications of EQUATIONS 3 (hereinafter discussed) to be performed serially using inner products.

Figure 2:
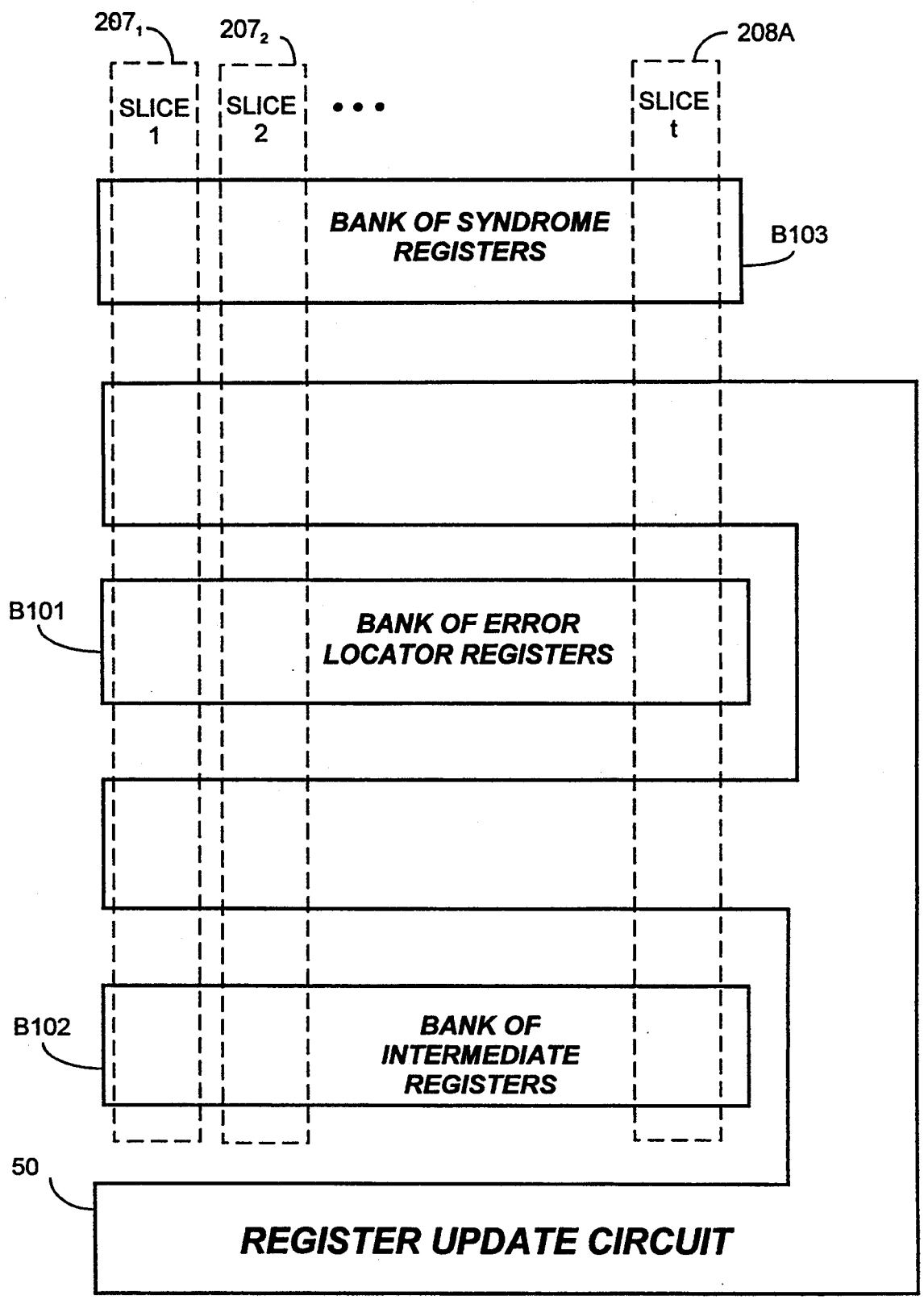
FIG. 2 is a schematic view showing a block diagram which generally depicts a decoder of the system of FIG. 1.

FIG. 2 is a block diagram of decoder circuit 199 generally. Decoder circuit 199 comprises a bank B101 of error locator or $\sigma$ registers; a bank B102 of intermediate or $\tau$ registers; a bank B103 of syndrome registers; and, a register update circuit 50. Details of differing embodiments of decoder circuit 199 are provided with respect to FIGS. 2A–2B. It will subsequently be seen that portions of decoder circuit 199 form a plurality of "slices" $207_1$, $207_2$, . . . $207_{t-1}$, 208A. The slices are discussed in more detail below, particularly with reference to FIG. 3A, FIG. 3B, 3C, and FIG. 3D.

Figure 2A:
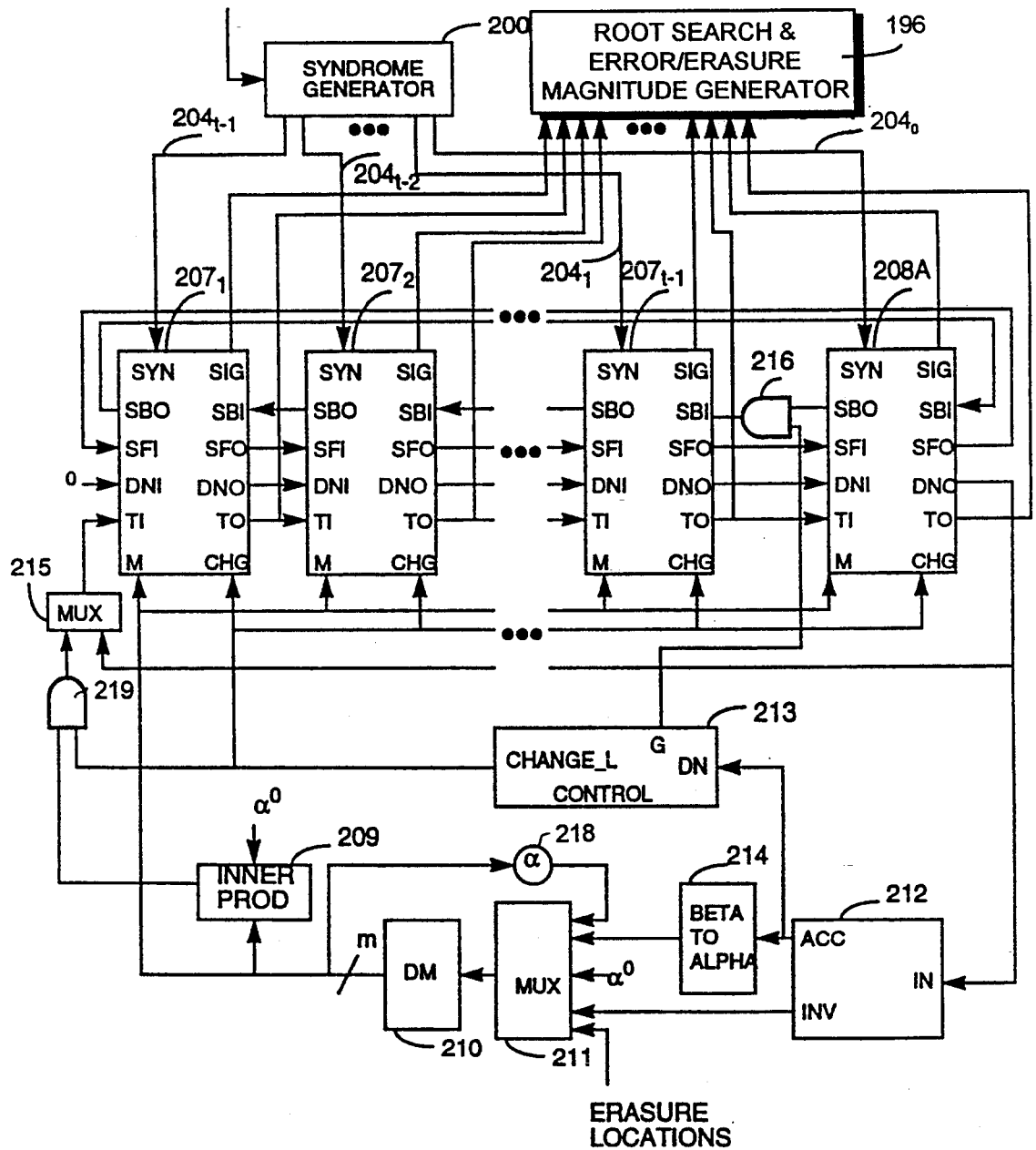
FIG. 2A is schematic view of a decoder circuit according to an embodiment of the invention (which operates in an errors and erasure mode) along with a syndrome generator, and buffer, and which incorporates erasure correction.
Figure 2B:
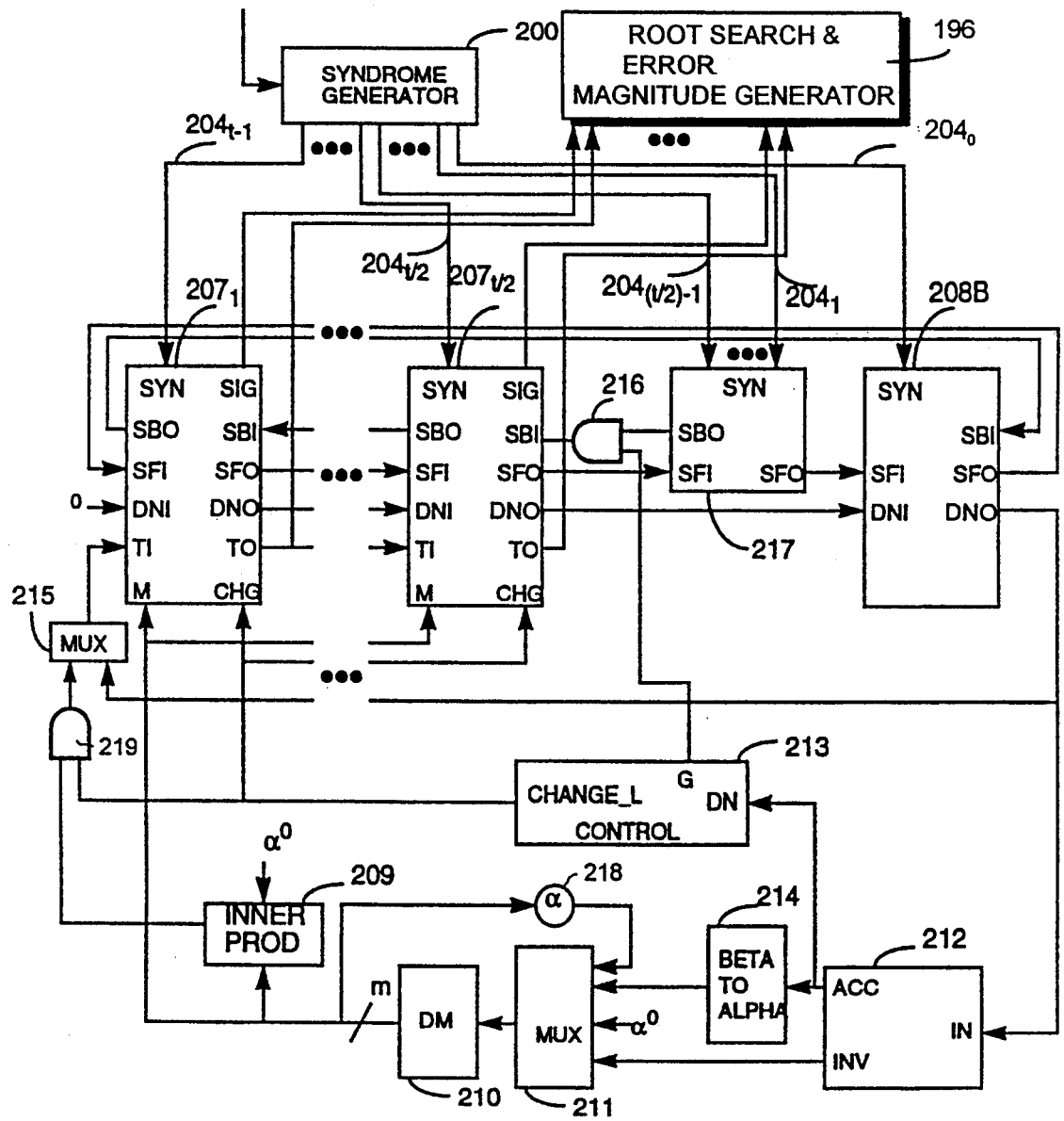
FIG. 2B is schematic view of a decoder circuit according to an embodiment of the invention (which operates in an errors only mode) along with a syndrome generator, error/locator generator, and buffer, and which does not incorporate erasure correction.

Decoder circuit 199 can be operated in either of two modes: decoding of errors and erasures (errors and erasures mode) or decoding of errors only (errors only mode). FIG. 2A shows details of the decoder circuit for the errors and erasures mode; FIG. 2B shows details of the decoder circuit for the errors only mode. Decoder circuit 199 of FIG. 2A can simultaneously correct u errors and v erasures (errors whose locations are known) as long as $2u+v$ is not greater than t.

FIG. 2A shows signals which are inputted to and outputted from slices 207 and 208A in an errors and erasures mode. These signals include the following m-bit signals: syndrome data signal SYN, a syndrome shifted backwards output signal SBO, a syndrome shifted backwards input signal SBI, a syndrome shift forward input signal SFI, a syndrome shift forward output signal SFO, a $\tau$ input signal TI, a $\tau$ output signal TO, and, a discrepancy-related input signal M. A one bit discrepancy-forming input signal DNI is inputted into each slice 207, 208A, while a one bit discrepancy-forming output signal DNO is outputted from each slice 207, 208A. In addition, a one bit coefficient output line SIG is connected from each slice to error locator generator 203 so that output from error locator register 101 can be serially outputted.

FIG. 2A shows some of the elements included in register update circuit 50. These elements include an inner product circuit 209; a discrepancy-related register DM 210; a DM register-controlling MUX 211; a discrepancy inversion circuit 212; a controller 213; a $\beta$ to $\alpha$ basis conversion circuit 214; a TI input-controlling MUX 215; a zero backward fill AND gate 216; a multiplier feedback circuit 218; and, a first slice $\tau$-AND gate 219. Yet other elements included in register update circuit 50 include the non-register components of slices 207 and 208A, which are discussed below.

As shown in FIG. 2A, output signal DNO from slice 208A is applied both to an input of discrepancy inversion circuit 212 and to a first input pin of MUX 215. Discrepancy inversion circuit 212 has two m-bit output ports, a first output port being labeled ACC and a second output port being labeled INV. As hereinafter described, a current discrepancy value $d_n$ (in $\beta$ basis representation) is outputted from port ACC during the first phase of an error locator iteration. From port ACC the current discrepancy value $d_n$ is applied both to input pin DN of controller 213 and to $\beta$ to $\alpha$ basis conversion circuit 214. Upon completion of a second phase of an error locator iteration, discrepancy inversion circuit 212 outputs an inverted value of the discrepancy $(d_n^{-1})$ determined during the first phase, which inverted value then becomes an inverted prior discrepancy (e.g., $d_{n-1}^{-1}$) during the first phase of the next iteration.

Figure 7:
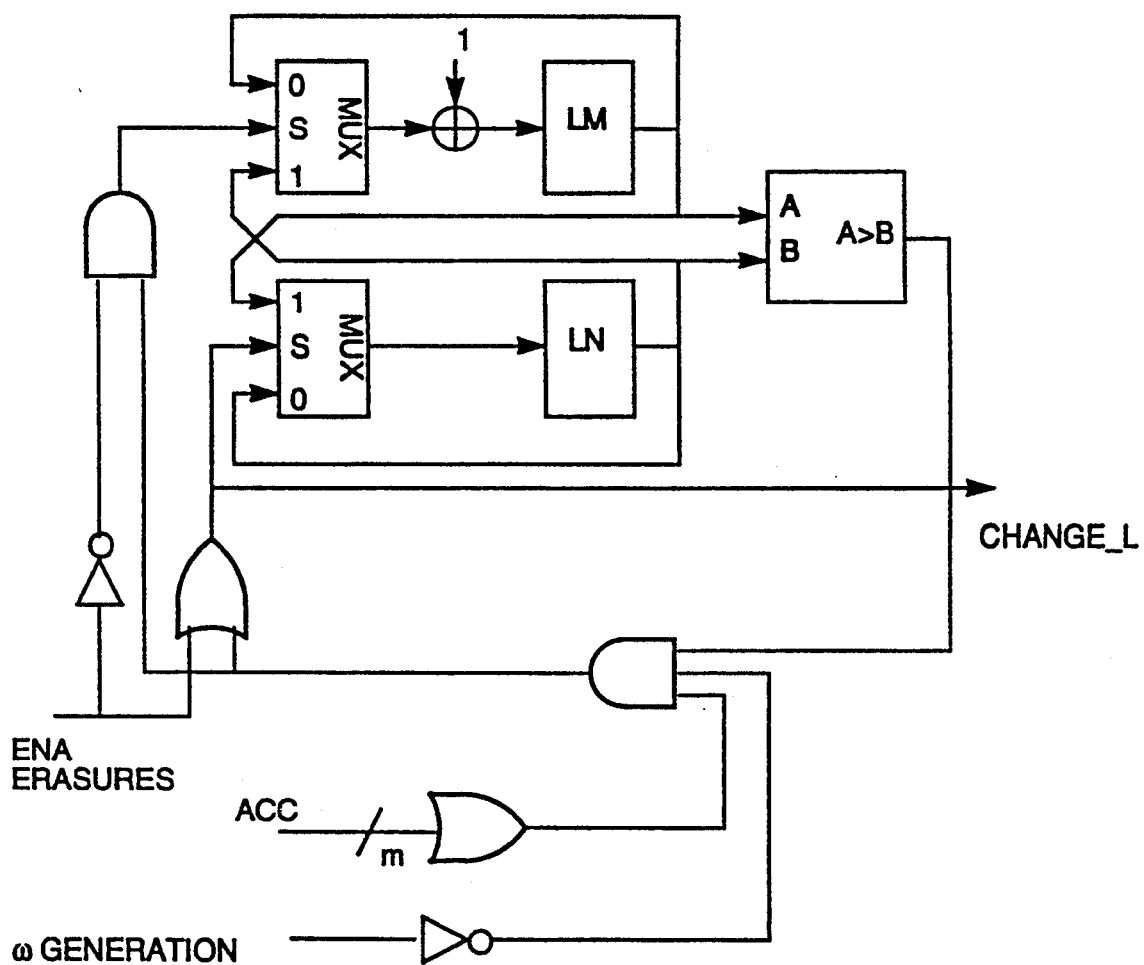
FIG. 7 is a schematic view of portions of a controller according to an embodiment of the invention.
Figure 8:
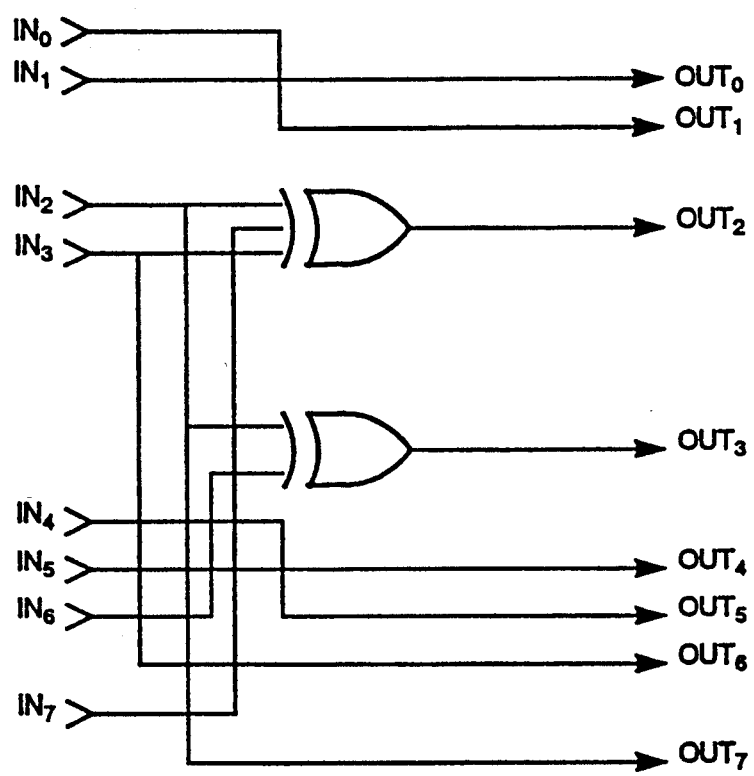
FIG. 8 is a schematic view of a circuit which translates from the dual (e.g., second) basis to the standard (e.g, first) basis.

Controller 213 uses the non-converted current discrepancy value $d_n$ obtained from circuit 212 to generate signals G and CHANGE_L in the manner depicted in FIG. 7. Signal CHANGE_L is applied to a first input pin of AND gate 219 and to slices 207 and 208A in the manner depicted in FIG. 3A, FIG. 3B, and FIG. 3C. Signal CHANGE_L refers to a change in the length of the connection polynomial, which is understood by the man skilled in the art.

DM-register controlling MUX 211 receives a plurality of selectable m-bit inputs, including the current discrepancy (in $\alpha$-basis representation from basis conversion circuit 214); the inverted prior discrepancy $d_{n-1}^{-1}$ (from inversion circuit 212); the value $\alpha^0$; erasure location values (from erasure location value generator 197); and, an $\alpha$-multiple of the contents of DM register 210 (from multiplier feedback circuit 218). DM-register controlling MUX 211 is, in turn, controlled by timer/controller 198 which selects among the possible inputs in accordance e.g. with the iteration phase.

An output port of DM-register controlling MUX 211 is connected to an input port of DM register 210. An output port of DM register 210 is connected to the multiplier feedback circuit 218; to a first input of inner product circuit 209; and to slices 207 and 208A in the manner illustrated by FIG. 3A and FIG. 3B. Inner product circuit 209 receives $\alpha^0$ as a second input and generates an output signal for application to a second pin of first slice $\tau$-AND gate 219.

The errors only decoding circuit of FIG. 2B differs slightly from the errors and erasures decoding circuit of FIG. 2A. In particular, for the errors only mode of FIG. 2B, slices $207_{(t/2)-1}$ through $207_{t-1}$ form a collective slice circuit 217 and DM-register controlling MUX 211 does not receive erasure location values.

It is understood from FIG. 2 and FIG. 2A, for example, that decoding circuit 199 comprises t number of slices, in particular nominal slices 207 and terminator slice 208A. Slices 207 and 208A are connected together in the manner shown in FIG. 2A for the errors and erasures mode and in the manner shown in FIG. 2B for the errors only mode. In both modes, slice 207k is representative for slice k for k=1,2,...,t−1 and 208A represents slice t.

Figure 3A:
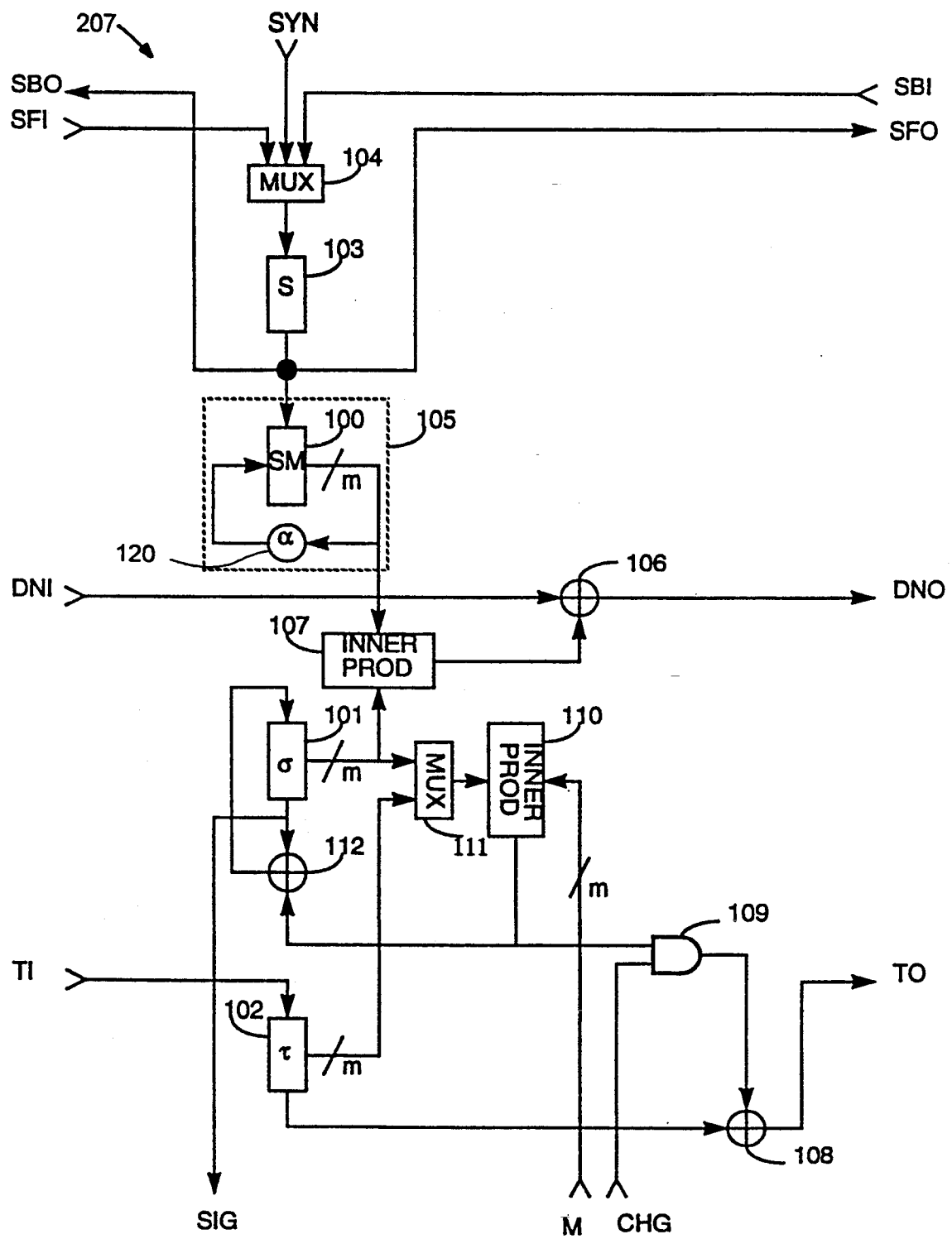
FIG. 3A is a schematic view of a slice of a decoder circuit according to an embodiment of the invention.
Figure 3B:
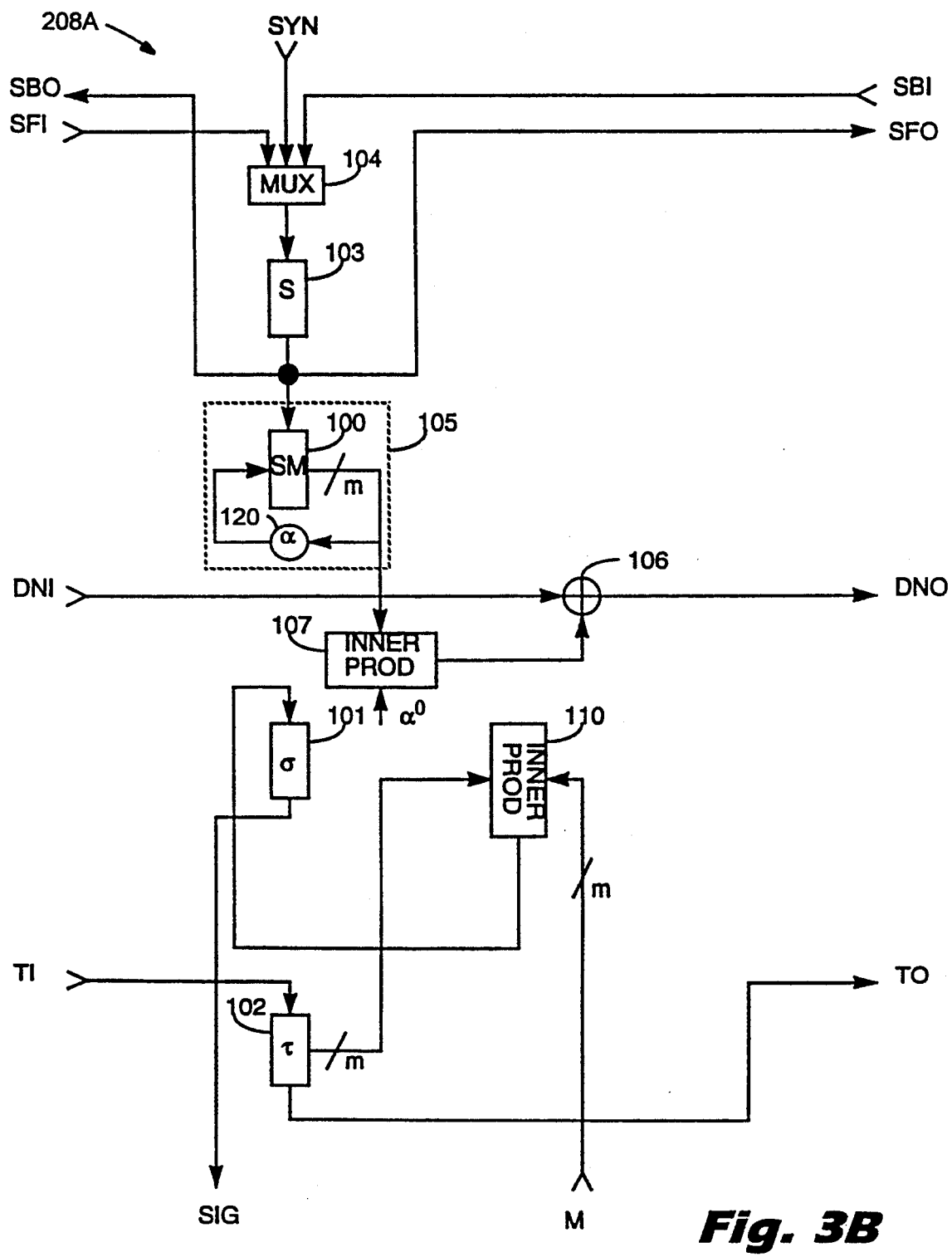
FIG. 3B is a schematic view of a terminal slice of a decoder circuit (errors and erasures mode) according to an embodiment of the invention.

FIG. 3A shows details of slices 207 for the errors and erasure mode while FIG. 3B shows details of slice 208A for the errors and erasures mode. In the errors only mode, for which a decoder circuit is shown in FIG. 2B, slice $207_1$ through and including slice $207_{t/2}$ are identical to the slices 207 illustrated in FIG. 3A. However, for the errors only mode, slices $207_{(t/2)-1}$ through $207_{t-1}$ form the collective slice circuit 217 (shown in FIG. 3C) and slice 208B is as shown in FIG. 3D.

As previously described, FIG. 3A shows that slices 207 comprise registers 101, 102, and 103. As also shown in FIG. 3A, syndrome register 103 is loaded via a MUX 104 with syndrome data either from syndrome generator 200 (signal SYN) or from a syndrome register in one of two adjacent slices (using either signal SFI or signal SBI). A select pin of MUX 104 is controlled by timer/controller 198 in accordance with iteration number, phase of iteration, and type of iteration. Error locator registers 101 and intermediate registers 102 are all initialized to zero.

Other components of slices 207 are included in register update circuit 50, in particular: modified-syndrome multiplication circuit 105; adder 106; discrepancy-contributing inner product circuit 107; adder 108; τ-output AND gate 109; an updating multiplier or inner product circuit 110; coefficient selecting-MUX 111; and adder 112. As with other MUXes described herein, coefficient selecting-MUX 111 is controlled by timer/controller 198 in accordance with iteration number, phase of iteration, and type of iteration.

A multiplicative product of each slice is generated by discrepancy-generating inner product generator circuit 107. Discrepancy-contributing inner product generator circuit 107 of a slice takes the inner product of the modified syndrome register 100 of the slice (in first or α basis representation) and the contents of the intermediate register 102 of the slice (in second or β basis representation). The product of two elements of $GF(2^m)$, where one element is represented in the standard or α basis and one element is represented in the dual or β basis, can be produced serially, i.e. one output bit per clock, by taking the inner product of the two elements and multiplying one of the elements by α on each clock. Thus, in connection with the inner product generated by the discrepancy-contributing inner product generator circuit 107, the modified syndrome register 100 initially receives the syndrome value of its corresponding syndrome register 103, but is updated to contain an α-multiple of the syndrome value by virtue of multiplier feedback circuit 105.

Figure 6:
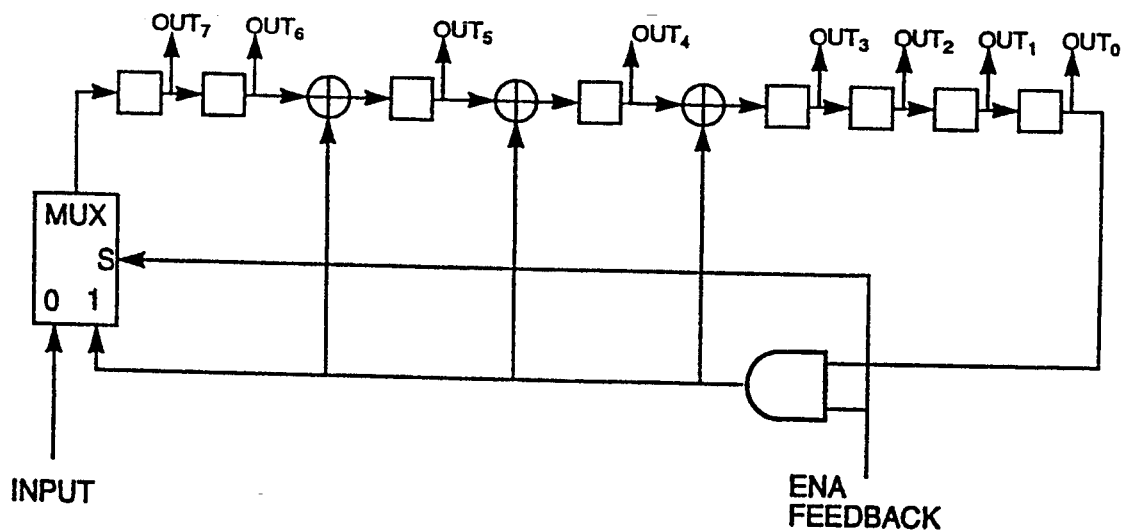
FIG. 6 is a schematic view of a modified-syndrome multiplication circuit according to an embodiment of the invention.

Output pins of error locator register 101 are connected both to a first port of inner product circuit 107 and to a first port of coefficient selecting-MUX 111. A second port of inner product circuit 107 is connected to modified-syndrome multiplication circuit 105. As shown in FIG. 3A, modified-syndrome multiplication circuit 105 includes a modified syndrome register 100 which receives a syndrome value from syndrome register 103 paired therewith. Modified syndrome register 100 has an α-multiple feedback circuit 120 connected thereto, such that the output of modified syndrome register 100 is an α-multiple of the syndrome value stored in register 103. FIG. 6 is a schematic diagram of details of modified-syndrome multiplication circuit 105 for the example field $GF(2^8)$.

During a first phase of each error locator iteration, inner product circuit 107 takes the inner product of the m-bit quantity $\sigma^{(n)}$ (from the error locator coefficient register 101) and the m-bit quantity which is α-multiple of the syndrome value stored in register 103 (from modified syndrome register 100) to produce a bit for application to adder 106. Adder 106 adds the resultant bit from inner product circuit 107 to a signal input (from an upstream slice) on line DNI to yield output signal DNO (for application to a downstream slice).

Coefficient selecting-MUX 111 has its second input port connected to an output port of the intermediate register 102. An output port of MUX 111 is connected to a first input port of inner product register 110. A second input port of inner product register is connected by line M to DM register 210 in the manner already described. An output port of inner product register 110 is connected both to a first input pin of AND gate 109 and to a first input of adder 112. An output port of adder 112 is connected to an input port of error locator register 101. A serial output port of error locator register 101 is connected both to a second input of adder 112 and by serial line SIG to root search and error/erasure magnitude generator 196 (see FIG. 2A). A second output port of intermediate register 102 is connected to a first input port of adder 108. A second input port of adder 108 is connected to an output port of AND gate 109. AND gate 109 has its first input port connected to the output port of inner product circuit 110 and its second input port connected by line CHANGE_L to controller 213 in the manner already described.

Slice 208A of FIG. 3B (errors and erasures mode) differs slightly from slices 207, as appears from a comparison of FIG. 3A (slices 207) and FIG. 3B (slice 208A). In particular, in slice 208A, MUX 111, adder 108, AND gate 109, and adder 112 are eliminated. The output port of error locator register 101 is connected only to coefficient output line SIG. The discrepancy-contributing inner product circuit 107 of slice 208A receives the value $\alpha^0$ at its first port and has its second port connected to modified-syndrome multiplication circuit 105. Inner product circuit 110 has its input port connected to the output port of the intermediate register 102. The output of inner product circuit 110 is connected only (and directly) to the input port of locator coefficient register 101. The output port of intermediate register 102 is connected to line TO.

Figure 3C:
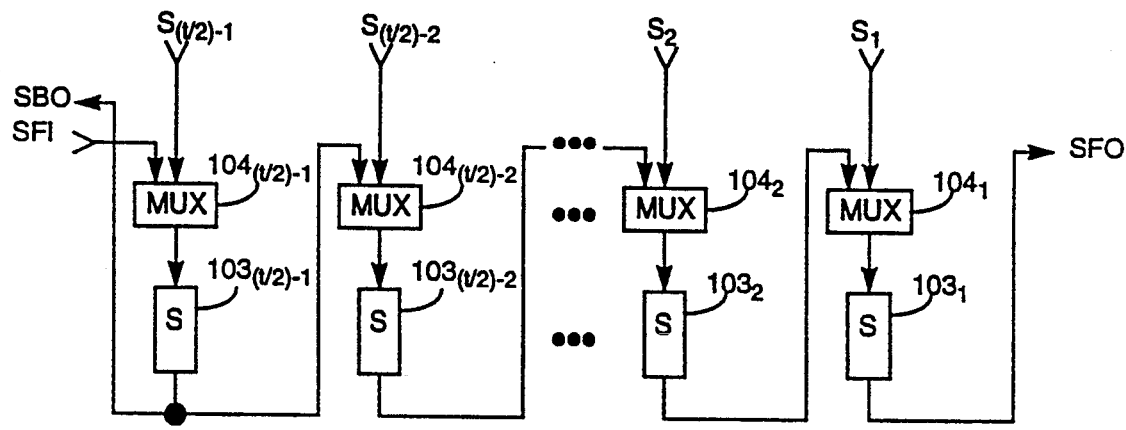
FIG. 3C is a schematic view of a collective slice circuit of a decoder circuit (errors only mode) according to an embodiment of the invention.
Figure 3D:
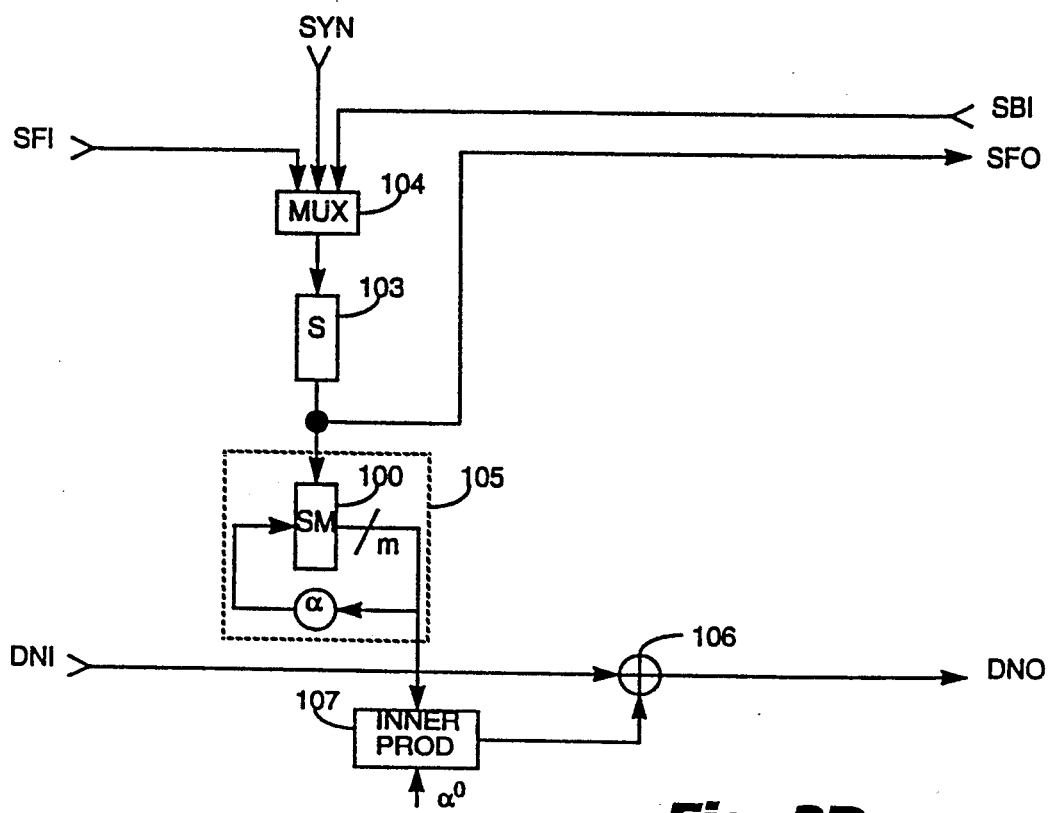
FIG. 3D is a schematic view of a terminal slice of a decoder circuit (errors only mode) according to an embodiment of the invention.

Slice 208A of FIG. 3D (errors only mode) differs from slice 208A of FIG. 3C (errors and erasures mode) by elimination of locator coefficient register 101, intermediate coefficient register 102, and inner product circuit 110.

The structure of discrepancy inversion circuit 212 is understood from U.S. patent application Ser. No. 08/147,758 filed on Nov. 4, 1993 and its continuation U.S. patent application Ser. No. 08/325,831 entitled "FINITE FIELD INVERSION", both of which are incorporated herein by reference.

Figure 5:
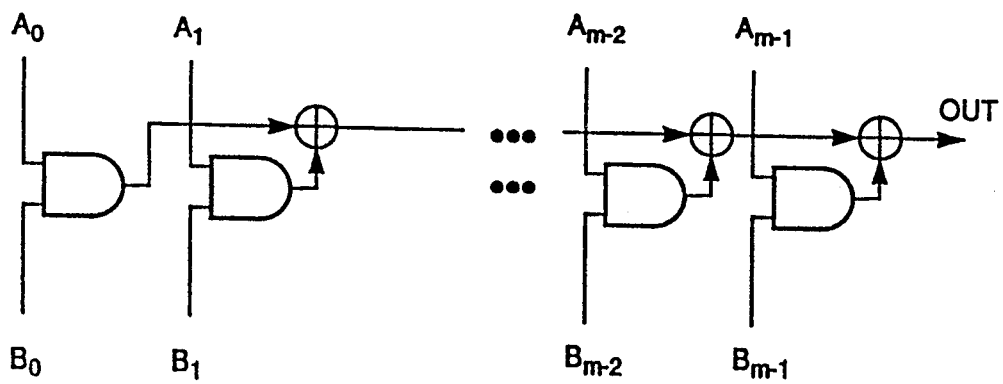
FIG. 5 is a schematic view of an inner product generator circuit.

FIG. 5 shows a schematic diagram of inner product generator circuit 107 for one illustrative example of the invention. In the illustrative example of FIG. 5, it is assumed that the field is GF($2^8$) with field generator $x^8+x^4+x^3+x^2+1$. As taught in U.S. patent application Ser. No. 08/147,758 filed on Nov. 4, 1993 and its continuation U.S. patent application Ser. No. 08/325,831 entitled "FINITE FIELD INVERSION", both of which are incorporated herein by reference, the $\beta$ representation of an element is governed by the choice for $\alpha_0$. For the illustrative example it is assumed that $\alpha_0$ is $\alpha^{-4}$.

OPERATION: OVERVIEW

Figure 9:
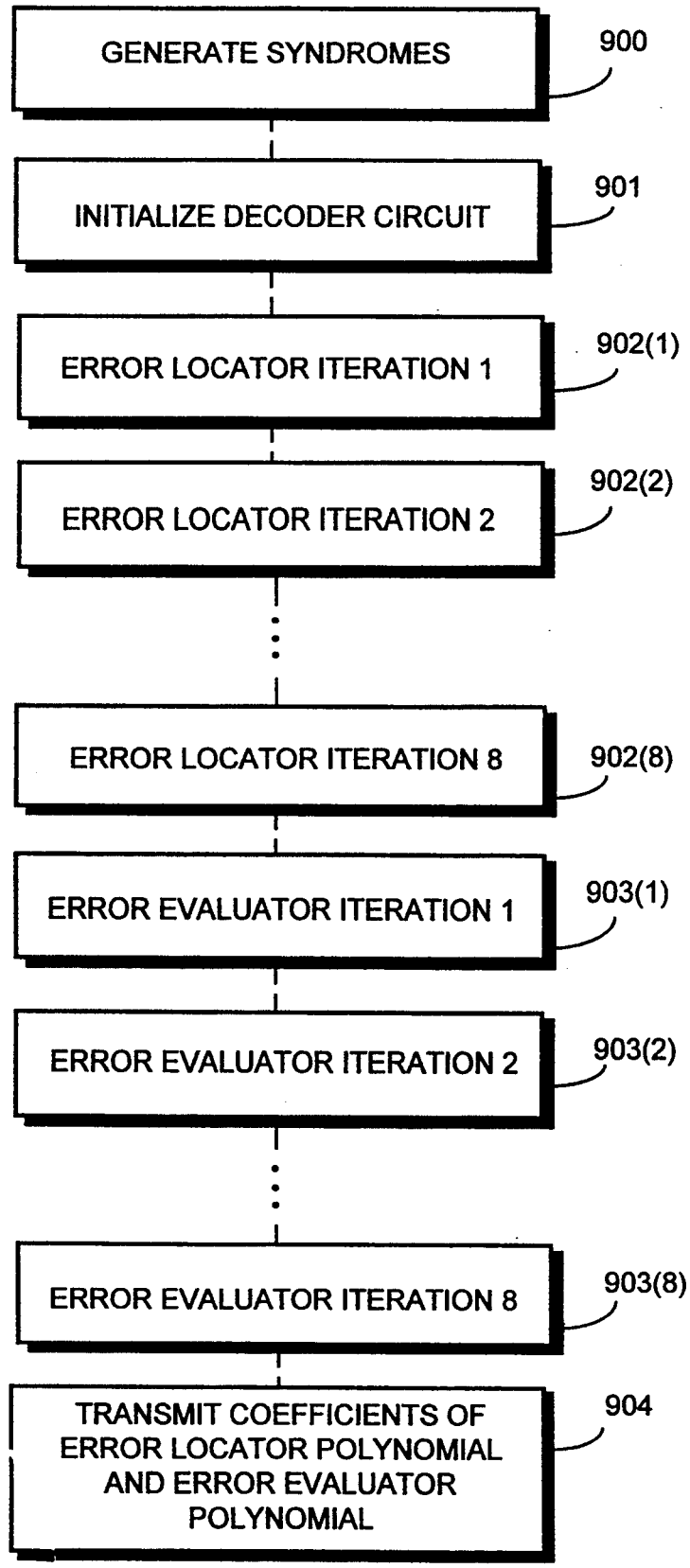
FIG. 9 is a flowchart showing general steps involved in error correction according to an embodiment of the invention.

FIG. 9 shows general steps involved in error correction of a codeword according to the present invention, beginning with generation of syndromes $S_0, S_1, \ldots S_7$ for a codeword at step 900 by syndrome generator 200. Step 901 involves initialization of decoder circuit 199. After initialization, decoding circuit performs a plurality of error locator iterations (steps 902(1) through 902(8)) followed by a plurality of error evaluator iterations (steps 903(1) through 903(8)). The number of iterations depends on the number of check symbols in the codeword and is illustrated as eight in the present embodiment. As discussed subsequently, TABLE 1 reflects operations occurring during error locator iteration 1 [step 902(1)]; TABLE 2 reflects operations occurring during error locator iteration 2 [step 902(2)]; and TABLE 3 reflects operations occurring during error locator iteration 8 [step 902(8)].

An objective of the error locator iterations is to obtain coefficients of the error locator polynomial $\sigma(x)$ to store in the error locator registers 101. An objective of the error evaluator iterations is to obtain coefficients of the error evaluator polynomial $\omega(x)$ in the intermediate registers ($\tau$ registers) 102. After obtaining the final values of the coefficients, at step 904 the coefficients of the error locator polynomial $\sigma(x)$ [in the error locator registers 101] are serially transmitted (on lines SIG) to root search and error/erasure magnitude generator 196 and the coefficients of the error evaluator polynomial $\omega(x)$ [in the intermediate registers ($\tau$ registers) 102] are serially transmitted (on lines TO) to root search and error/erasure magnitude generator 196.

As will be explained further herein, each error locator iteration comprises two phases or stages: a first phase (also called phase A) and a second phase (also called phase B). During phase A of each error locator iteration, the current discrepancy $d_n$ is generated and the coefficient values in the intermediate registers ($\tau$ registers) 102 are updated. During phase B of each error locator iteration, the coefficient values in the error locator registers ($\sigma$ registers) 101 are updated and, at the end of phase B, the inverse of the discrepancy $d_n^{-1}$ is available (which becomes known as the inverse of the prior discrepancy or $d_{n-1}^{-1}$ during the next error locator iteration).

The error locator iterations of the present invention include an implementation of the Berlekamp-Massey algorithm based on the following recursion rules:
1) update $\tau$ $$\tau^{(n)}(x)=x\tau^{(n-1)}(x) \text{ or } x(\tau^{(n-1)}(x)+d_{n-1}^{-1}\sigma^{(n)}(x))$$

calculate $d_n$:

$$d_n=\Sigma\sigma_k S_{n-k}$$

2) update $\sigma$:

$$\sigma^{(n+1)}(x)=\sigma^{(n)}(x)-d_n\tau^{(n)}(x)$$

During the first m clocks (e.g., phase A) of an error locator iteration, the $\tau(x)$ for the previous iteration is calculated, i.e. $\tau(n)$ (x) is calculated, not $\tau(n+1)$ (x). According to the present invention, the coefficients of the polynomials $\tau(x)$ and $\sigma(x)$ need not be updated at the same time since they do not depend on each other, i.e. $\sigma^{(n+1)}(x)$ depends on $\tau^{(n)}(x)$ and $\tau^{(n)}(x)$ depends on $\sigma(n)(x)$, not $\sigma^{(n-1)}(x)$. Therefore $\tau(x)$ can be updated using $\sigma(x)$ and then $\sigma(x)$ can be updated using the already updated $\tau(x)$. The final update for $\tau(x)$ is never done (which is acceptable since $\tau(x)$ is only useful for updating $\sigma(x)$ and, moreover, once the final update for $\sigma(x)$ is done the final update for $\tau(x)$ is not needed).

The recursion equation for $\tau(x)$ can be written as:

$$\tau^{(n+1)}(x)=x\tau^{(n)}(x) \text{ or } x\tau^{(n)}(x)+xd_n^{-1}\sigma^{(n+1)}(x).$$

To show that these equations are valid, the recursion equation for $\sigma^{(n+1)}(x)$ is substituted into the recursion equation for $\tau(x)^{(n+1)}$ to yield:

$$\tau^{(n+1)}(x)=x\tau^{(n)}(x) \text{ or}$$
$$x\tau^{(n)}(x)+xd_n^{-1}(\sigma^{(n)}(x)-d_n\tau^{(n)}(x))=x\tau^{(n)}(x) \text{ or}$$
$$xd_n^{-1}\sigma^{(n)}(x)$$

which is identical to EQUATIONS 1.

During the first m clocks of an error locator iteration, the inverse of the discrepancy of the previous iteration (i.e., $d_{n-1}^{-1}$) is used. In accordance with an advantage of the present invention, a sequential method may be used for obtaining $d_{n-1}^{-1}$ instead of the usual $2^m \times m$ ROM. This sequential method is implemented by the discrepancy inversion circuit 212, which is more fully described in U.S. patent application Ser. No. 08/147,758 filed on Nov. 4, 1993 and its continuation U.S. patent application Ser. No. 08/325,831 entitled "FINITE FIELD INVERSION", both of which are incorporated herein by reference.

In the update equation for $\tau^{(n)}(x)$, the first choice is taken when the order of $\sigma(x)$ is not changed and the second choice is taken when the order of $\sigma(x)$ is changed. If the signal CHANGE_L is used to indicate those iterations during which the order of $\sigma(x)$ is changed, then the recursion equations can be written according to EQUATIONS 3.
EQUATIONS 3:
1) update $\tau$:

$$\tau^{(n)}(x)=x(\tau^{(n-1)}(x)+d_{n-1}^{-1}\sigma(x)^*\text{CHANGE\_L})$$

calculate $d_n$:

$$d_n = \sum_{k=0}^{t-1} \sigma_k^{(n)} S_{n-k}$$

2) update $\sigma$:

$$\sigma^{(n+1)}(x)=\sigma^{(n)}(x)-d_n\tau^{(n)}(x)$$

OPERATION: SYNDROME GENERATION

The syndrome generation step 900 of FIG. 9 is conventional and understood by the man skilled in the art.

Assume the Reed-Solomon codeword generator polynomial is:

$$G(x) = \prod_{k=0}^{t-1} (x + \alpha^{L+k})$$

Then a data sequence D(x) is coded into a codeword C(X) in the following way: $C(x) = D(x)x^t - (D(x)x^t)$ mod $G(x)$. When a possibly corrupted codeword, $R(x) = C(x) + E(x)$, is received it is stored in buffer 194 and sent to the syndrome generator 200. At some later point, as determined by the asynchronous control of buffer 194, a byte-to-be corrected in the codeword R(x) is sent to register 195 in FIG. 2. The syndromes are calculated as:

$$S_k = R(x) \bmod (x + \alpha^{L+k}) \text{ for } k = 0, 1, \ldots, t-1.$$

OPERATION: INITIALIZATION

In initialization step 901 (see FIG. 9), syndrome values $S_0, S_1, \ldots S_7$ are loaded into the syndrome registers 103. In addition, the error locator registers 101, intermediate registers 102, and other values are initialized.

In the loading of syndrome values, syndrome $S_k$ is shifted into slice $207_{t-k}$ for $k = 1, 2, \ldots, t-1$ and $S_0$ is shifted into slice 208A. Within each slice, shown in FIG. 3A for example, a syndrome is shifted into the S register 103 via MUX 104. Thus, initially syndrome $S_0$ is loaded into syndrome register 103 of slice 208A, while syndrome values $S_1, S_2, \ldots S_7$ are loaded into syndrome registers of slices $207_7, 207_6, \ldots 207_1$, respectively. The syndrome values are serially loaded (one bit at a time) from syndrome generator 200 into the respective registers 103.

After the syndromes are initially shifted into the S registers 103, a forward shift of the syndromes is then performed wherein the contents of each S register 103 is serially shifted out (from the SFO output of each slice) to the SFI input of the next slice, and gated into the S register 103 of the next slice via MUX 104. In this initialization shift, the output of slice t (block 208A) feeds the input of slice $207_1$, thereby forming a circular shift. During this circular shifting, the output of the S register 103 of each slice is also shifted into its paired SM register 100.

Error locator registers 101 and intermediate registers 102 of slice 208A slices $207_1, 207_2, \ldots 207_7$ are reset to zero (by timer/controller 198) before the first phase of the first error locator iteration for the codeword.

Controller 213 (see FIG. 2A, for example) outputs the CHANGE_L signal to the CHG inputs of each slice. The CHANGE_L signal is initialized to "1" before starting the first iteration. The controller 213 also maintains two variables, LN and LM, which are initialized to 0 and 1 respectively. Also the DM register 210 is initialized to the alpha basis representation of $\alpha^0$ via MUX 211, which is the initial value for $d_{n-1}^{-1}$.

OPERATION: DISCREPANCY GENERATION

This brief discussion of generation of the current discrepancy $d_n$ is a prelude to a discussion of actual error locator iterations. Using the expression for $d_n$ from $$d_n = \sum_{k=0}^{t-1} \sigma_k^{(n)} S_{n-k} \qquad \text{EQUATION 3}$$

it is seen that the discrepancy $d_n$ is derived from values in the locator coefficient registers 101 (i.e., the $\sigma$ registers) and the syndromes. Whereas the values stored in the locator coefficient registers 101 are in beta or second basis representation, the syndrome values are in the alpha or first basis representation. Accordingly, in order to multiply these two values together, one of the values must be repetitively multiplied by $\alpha$. In the illustrated embodiment, the syndromes are multiplied by $\alpha$ using the modified-syndrome multiplication circuit 105 as aforedescribed.

The multiplication which yields the current discrepancy is partially accomplished using inner product circuit 107 (shown in more detail for one example field in FIG. 5). Inner product circuit 107 comprises part of a multiplier which forms part of a larger inner product (a term of the current discrepancy $d_n$). In particular, inner product circuit 107 (together with $\sigma$ register 101 and the modified-syndrome multiplication circuit 105) comprises a multiplier structure that produces, for each clock pulse, a serial output which is applied to adder 106.

Adder 106 sums the serial outputs of comparable multipliers of other slices to obtain an inner product of the syndromes with the current coefficients of the error locator polynomial. Thus, it should be understood that all slices are simultaneously conducting a multiplication and producing a one-bit output per clock cycle, which one-bit output is added (by adders 106) to the output of other slices to obtain a bit of the current discrepancy. Moreover, during the clock cycle in which a bit of the discrepancy $d_n$ is generated, that bit is transmitted to the discrepancy inversion circuit 212.

OPERATION: ERROR LOCATOR ITERATION (PHASE A)

The operation of decoder circuit 199 during the error locator iterations is understood with respect to TABLE 1, TABLE 2, and TABLE 3. The TABLES reflect operations during error locator iterations 1, 2, and 8, respectively (see steps 902(1), 902(2), and 902(8), respectively). As mentioned before, each error locator iteration includes both a first phase (also known as phase A) and a second phase (also known as phase B).

Figure 4:
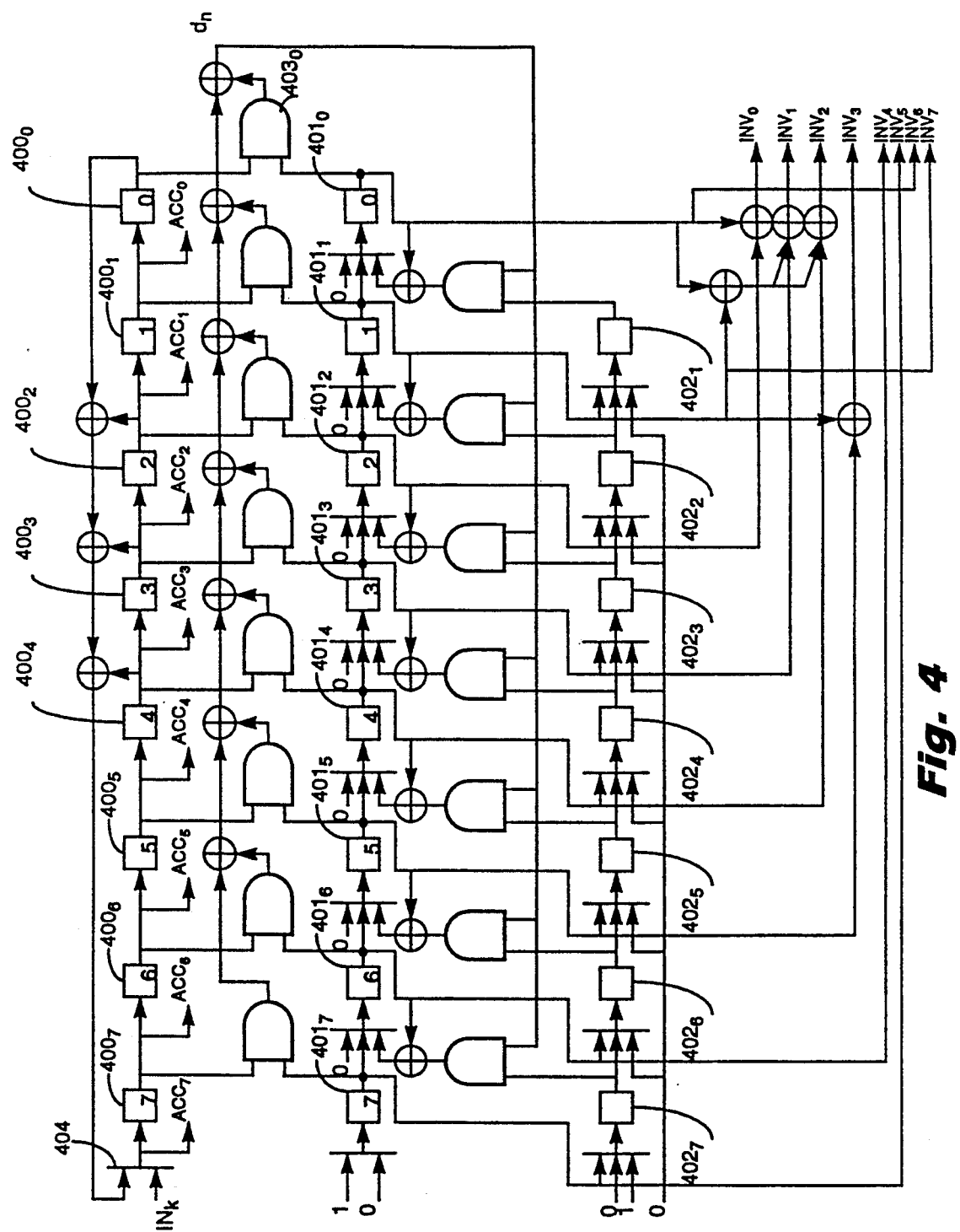
FIG. 4 is a schematic view of a circuit for calculating multiplicative inverses in $GF(2^8)$.

During the first error locator iteration for each codeword, all slices $207_1$–$207_7$ and 208A have zero initialized in the error locator registers (i.e., $\sigma$ registers) 101. Accordingly, slices $207_1$–$207_7$ contribute nothing to the discrepancy sum taking place during phase A of the first iteration. However, during the first error locator iteration, slice 208A (which has been initialized with syndrome $S_0$ and with $\alpha^0$ as the other input to inner product circuit 107) will produce a non-zero output (basically, $S_0\alpha^0 = S_0$). Thus, during the first clock of phase A, inner product circuit 107 of slices 207 put out a bit of zero as their product. These bit zeros are added together by adders 106 to the non-zero output of slice 208A, which sum is bit 0 of the current discrepancy $d_n$. The thusly-obtained bit 0 of the current discrepancy $d_n$ is shifted during the same clock cycle to discrepancy inversion circuit 212 (see FIG. 4), which immediately begins its inversion.

During each clock cycle of the first error locator iteration, a further bit of the first term of the current discrepancy is obtained (from slice 208A exclusively during the first iteration) and applied to discrepancy inversion circuit 212.

During phase A of the first iteration, the intermediate registers (i.e., $\tau$ registers) 102 have all been initialized to zero. During the first iteration, $\tau_0$ (register 102 in slice 207$_1$) is initialized to $\alpha^0$ by virtue of the fact that DM register 210 has been initialized to $\alpha^0$ and CHANGE-L has been initialized to 1.

During error locator iterations other than the first iteration for a codeword, the values in the intermediate registers ($\tau$ registers) 102 are updated. The manner in which the update of $\tau$ registers 102 is updated depends on the result of the previous iteration (e.g. whether there was a length change as indicated by signal CHANGE_L).

Basically, in order to update the values in the intermediate registers ($\tau$ registers) 102 during phase A, decoder circuit 199 multiplies values in the error locator registers 101 (e.g., $\sigma$ registers) by $d_{n-1}^{-1}$. This implements EQUATIONS 3, which state in part $$\tau^{(n)}(x) = x(\tau^{(n-1)}(x) + d_{n-1}^{-1}\sigma(x)*\text{CHANGE\_L})$$

The quantity $d_{n-1}^{-1}$ is initialized to $\alpha^0$ in the DM register 210 for the first iteration, and thereafter is generated by discrepancy inversion circuit 212 and loaded into DM register 210 via MUX 211.

More specifically describing the update of the intermediate register 102, during phase A the contents of the error locator register 101 is transmitted via MUX 111 to a first port of inner product circuit 110. The second input port of inner product register is connected by line M to DM register 210 to receive an $\alpha$-multiple of $d_{n-1}^{-1}$. The output of inner product circuit 110 is applied to AND gate 109 and (if required by signal CHANGE_L) is added (by adder 108) to the contents of the intermediate register 102 (i.e., $\tau$ register) for application on line TO to the $\tau$ register 102 of the rightwardly neighboring slice. If signal CHANGE_L does not require, the contents of the intermediate register 102 (i.e., $\tau$ register) are directly applied on line TO to the $\tau$ register 102 of the rightwardly neighboring slice without addition of the output of inner product circuit 110. Thus, it requires all clocks of phase A in order to update the intermediate registers 102 (i.e., $\tau$ register) of all slices.

The values in the error locator registers (e.g., $\sigma$ registers) 101 do not change during the first phase of an error locator iteration. However, the value in register SM 100 (initially loaded with the syndrome) is being clocked with $\alpha$ feedback during each clock cycle. The original syndrome value remains in register 103 during the first phase of each iteration.

At the end of phase A, all 8 bits of the current discrepancy have been shifted (in second or beta basis representation) into discrepancy inversion circuit 212; have been converted into first or $\alpha$ basis representation (by conversion circuit 214); and, have been muxed into DM register 210 for use during phase B. However, at the end of phase A, discrepancy inversion circuit 212 still needs another eight clock cycles (e.g., the duration of phase B) in order to generate the inverse of $d_n$.

Phase A execution of decoding circuit 199 differs from iteration to iteration primarily by the fact that registers 103 (and hence registers 100) and $\sigma$ registers 101 have been loaded/updated with different values. As explained below, during phase B syndrome values are circularly shifted and $\sigma$ register values are updated. Hence, during a second error locator iteration for a codeword, two slices (e.g, slices 208A and slice 207$_1$) will be operative in yielding current discrepancy $d_n$. Similarly, with respect to discrepancy generation, three slices will be operative during a third iteration, four slices during a forth iteration, and so on until all slices are operative during the eight (last) error locator iteration. At the end of each phase A execution, decoder circuit 199 has generated $d_n$; has shifted $d_n$ into discrepancy inversion circuit 212; and, has updated intermediate registers 102 (i.e., $\tau$ register) of all slices.

OPERATION: ERROR LOCATOR ITERATION, PHASE B

Phase B also has, in the illustrated embodiment, eight clock cycles. Three major actions occur during phase B: the syndromes are serially shifted to an adjacent slice; generation of the inverse of $d_n$ (which will be known as $d_{n-1}^{-1}$ during the next error locator iteration) is completed; and, values in the error locator registers ($\sigma$ registers 101) are updated using the values in the intermediate registers 102 and the value of $d_n$ which was just generated during phase A.

During phase B of each error locator iteration, decoder circuit 199 serially shifts the syndrome values in preparation for the next phase A so that a new $d_n$ can be generated during the next phase A. In this respect, a forward shift of the syndromes is performed wherein the contents of each S register 103 is shifted out the slice SFO output to the SFI input of the next slice and into the S register 103 of the next slice (via MUX 104). The output of slice 208A feeds the input of slice 207$_1$ forming a circular shift. During this shifting, the transmitting slice also shifts the outgoing syndrome value into its SM register 100.

At the beginning of phase B, DM register 210 contains not $d_{n-1}^{-1}$, but $d_n$ of the current iteration (which was just determined during phase A). The value $d_n$ in DM register 210 has been converted (by conversion circuit 214) to alpha representation, which is necessary for conducting an inner product operation with respect to the contents of the intermediate registers 102 ($\tau$ registers) which are in $\beta$ basis representation. After the first clock cycle of phase B, the value of $d_n$ is multiplied by $\alpha$ so that the contents of DM register becomes an $\alpha$-multiple of $d_n$ for use in phase B.

During phase A, the intermediate registers 102 (i.e., $\tau$ registers) were updated by shifted values while the error locator registers (e.g., $\sigma$ registers) 101 stayed fixed. During phase B, on the other hand, the error locator registers (e.g., $\sigma$ registers) 101 are updated while the intermediate registers 102 (i.e., $\tau$ registers) remain fixed. In fact, it is the intermediate registers 102 (i.e., $\tau$ registers) that are used to update the values of the coefficients of the error locator polynomial stored in the error locator registers 102.

During phase B, the coefficients of the error locator polynomial are updated according to EQUATIONS 3

$$\sigma^{(n+1)}(x) = \sigma^{(n)}(x) - d_n\tau^{(n)}(x)$$

The contents of the intermediate registers 102 (i.e., $\tau$ registers) are applied through MUX 111 to the first input port of inner product circuit 110. Inner product circuit 110 forms an inner product with the contents of the τ register and $d_n$ ($d_n$ having been applied on line M). The output of inner product circuit 110 is a serial bit (one bit per clock of phase B), which is added by single bit adder 112 to the serially shifted-out contents of error locator register (e.g., σ register) 101. Thus, it takes eight clock cycles to update the contents of the error locator register (e.g., σ register) 101 for each slice. The updating operation just-described for error locator register (e.g., σ register) 101 of one slice simultaneously occurs for all slices (there being, of course, differing values in the σ registers 101 of differing slices).

Thus, when phase A of the next error locator iteration begins, the phase A operations will be executed with the new values in the σ registers 101 as updated during the previous phase B. Also, at the end of phase B, discrepancy inversion circuit 212 has completed the inversion of $d_n$, which is available at the INV outputs and applied via MUX 211 into DM register 210 for use as $d_{n-1}^{-1}$ during phase A of the next error locator iteration.

At the end of phase B of the last (eighth) error locator iteration, the final values of the coefficients of the error locator polynomial for the codeword are stored in the σ registers 101.

OPERATION: ERROR EVALUATOR ITERATION

After completion of the last error locator iteration for a codeword (e.g., after step 902(8) of FIG. 9, the final values of the coefficients of the error locator polynomial for the codeword are stored in the σ registers 101. Yet remaining is the generation of coefficients for the error evaluator polynomial. Advantageously, using another eight iterations (distinctly known as error evaluator iterations) as depicted by steps 903(1)–903(8) of FIG. 9, decoder circuit 199 generates the error evaluator coefficients and stores those coefficients in the intermediate registers 102 (τ registers).

The final values of the coefficients of the error locator polynomial for the codeword are used to generate the error evaluator polynomial ω(x). The coefficients of the error evaluator polynomial ω(x) are defined as:

$$\omega_k = \sum_{j=0}^{k} \sigma_j S_{k-j}$$

for k=0, 1, ..., t−1. Because the form of the error evaluator polynomial ω(x) is the same as that for calculating $d_n$, the decoding circuit 199 can find coefficients for both polynomials. The coefficients are generated in t double phase iterations (assuming t errors to correct).

The error evaluator iterations are similar to phase A of the error locator iterations with the following modifications:

(1) During phase A of the last error locator algorithm iteration (e.g., step 902(8) of FIG. 9), the syndrome registers 103 in each slice are backward shifted, i.e. the contents of the S registers 103 are shifted out SBO output and into the SBI input of the preceding slice and into the S register 103 of the previous slice via MUX 104. A signal G from controller 213 is set to "1" during this backward shift of syndromes.

(2) During phase B of the last error locator iteration (e.g., step 902(8) of FIG. 9), the S registers 103 in each slice are again backward shifted and at the same time the output of the S register 103 in each slice is shifted into the SM register 100. During this and all subsequent backward shifts the signal G output from controller 213 is set to "0". Setting signal G in this manner forces "0"s into the SBI input of slice t−1 by AND gate 216.

(3) During phase A of each error evaluator iteration (also known as an ω iteration), the DNO output of slice t is $\omega_k$ where k is t−1 for the first ω iteration, t−2 for the second, etc., and 0 for the last ω iteration. $\omega_k$ is shifted into the TI input of slice 1 via MUX 215.

(4) During phase B of each ω iteration, the S registers 104 are backward shifted and also shifted into the SM registers 100. The σ registers 101 do not shift.

(5) The value of CHANGE_L is fixed at "0" as shown in FIG. 7. This allows all of the t registers to function as a single shift register so that after the t iterations the τ register in slice k contains $\omega_{k-1}$.

For example, after completion of the 8 clocks of a first error evaluator iteration, the eight bits of $\omega_7$ are loaded into τ register 102 of slice $207_1$. After completion of a second error evaluator iteration, the eight bits of $\omega_6$ are loaded into τ register 102 of slice $207_1$ and $\omega_7$ is transferred into τ register 102 of slice $207_2$. Similar processing continues for all eight error evaluator iterations until all coefficients $\omega_0$–$\omega_7$ are stored in slices $207_1$–208A, respectively.

During the error evaluator iterations, the previously-determined final σ coefficients remain undisturbed in σ registers 101.

After the t iterations the σ and t registers are then shifted m more times so that the error locator and error evaluator polynomials can be transferred to root search and error/erasure magnitude generator 196 (see FIG. 1).

OPERATION: COEFFICIENT TRANSFER

After completion of all error locator iterations and all error locator iterations, and as reflected by step 904 of FIG. 9, decoder circuit 199 transfers the final values for the coefficients of the error locator polynomial (stored in the σ registers 101) and the final values for the coefficients of the error evaluator polynomial (stored in the τ registers 102) to root search and error/erasure magnitude generator 196. Each slice of decoder circuit 199 has one σ coefficient in its σ register 101 and one ω coefficient in its τ register 102. Transfer from the σ register 101 and the τ register 102 occur (on lines SIG and TO, respectively) at a rate of one bit per clock (serial transfer), with serial transfers from both registers 101 and 102 occurring simultaneously. Thus, root search and error/erasure magnitude generator 196 receives simultaneously one bit of a σ coefficient from each slice and one bit of an ω coefficient from each slice.

Root search and error/erasure magnitude generator 196 supplies error patterns to adder 202 to correct data as it is retrieved from register 195. Error locations are found with a root search for σ(x), i.e. byte k is in error whenever $\sigma(\alpha^{-k})=0$. The error magnitude is then calculated as:

$$E_k = \frac{\alpha^{-k(L-1)}\omega(\alpha^{-k})}{\sigma'(\alpha^{-k})}$$

where σ' represents the first derivative of σ.

OPERATION: ERASURES

If the received sequence R(x) contains v erasures, then the erasure locations are input during the first v error locator iterations which are modified in the following way:

(1) At the end of each phase A of the first v iterations, instead of loading $d_n$ into DM register 210, the erasure location in the form of $\alpha$ raised to the $e_k$ power is loaded into DM register 210 via MUX 211 (see FIG. 2A). In this nomenclature, $e_k$ is the location of the $k^{th}$ erasure, i.e., the $e_k{}^{th}$ coefficient of R(x).

(2) At the end of each phase B of the first v iterations, instead of loading $d_n{}^{-1}$ into DM 210, $\alpha^0$ is loaded into DM register 210 via MUX 211.

(3) The signal CHANGE__L is fixed at "1" and at the end of each phase A, LN gets LM and LM gets LM+1. This is illustrated in FIG. 7.

Slice t, detailed in FIG. 3B, does not contain adder 112, since the only time that $\sigma_t$ is generated is when there are t erasures and no errors (in which case all iterations will be erasure iterations and the only time that the $\sigma$ register in slice t will receive a non-zero value will be on the last iteration).

OPERATION: ERRORS ONLY DECODING

FIG. 2B shows an error correction system of the invention which (unlike the system of FIG. 2A) does not incorporate erasure correction. Since at most t/2 errors may be corrected, only t/2 Berlekamp-Massey algorithm slices are needed. Thus, in the embodiment of FIG. 2B slices (t/2)+1 to t−1 are replaced with the collective modified slice circuit 217, detailed in FIG. 3C. The slices of circuit 217 contain only an S register 103 and associated MUX 104. Slice t of the system of FIG. 2B is replaced with a modified slice 208B which is detailed in FIG. 3D. Slice 208B of FIG. 3D which contains only S register 103 (with associated MUX 104); modified-syndrome multiplication circuit 105; and inner product circuit 107. During initialization of the system of FIG. 2B, the S register 103 in slice k is loaded with $S_{t-k}$, as before, with $k=1, 2, \ldots, t/2$. $S_0$ is loaded into slice 208B, as before, and the remaining syndromes are loaded into the S registers 103 contained in circuit 217. There are t iterations for generating $\sigma(x)$ and then t/2 iterations for generating $\omega(x)$. The $\omega(x)$ calculated by this system has coefficients:

$$\omega_k = \sum_{j=0}^{k} \sigma_j S_{k-j+t/2}$$

for $k=0, 1, \ldots, t/2-1$.

The t/2 coefficients of $\sigma(x)$ and the t/2 coefficients of $\omega(x)$ are then transferred into root search and error/erasure magnitude generator 196 to correct errors. A root search is performed as before and then the error magnitude is then calculated as:

$$E_k = \frac{\alpha^{-k(L-1+t/2)}\omega(\alpha^{-k})}{\sigma'(\alpha^{-k})}$$

U.S. patent application Ser. No. 08/326,126 simultaneously filed by Zook et al., entitled "ERROR CORRECTION METHOD AND APPARATUS", and incorporated herein by reference, provides one non-limiting example of a specific utilization of the present invention.

While the invention has been particularly shown and described with reference to the preferred embodiments thereof, it will be understood by those skilled in the art that various alterations in form and detail may be made therein without departing from the spirit and scope of the invention. For example, the invention has been described in an embodiment in which error correction is performed in real-time for use with error correcting codes such as, but not limited to, the Reed-Solomon code. However, the invention can be used in any application of the Berlekamp-Massey algorithm in which the inventive organization of the two phase calculation is of value. Since one of the primary values of the inventive approach is minimization of silicon area in a semiconductor implementation, as compared with previous approaches, the invention is useful wherever chip space is significant.

TABLE 1

ERROR LOCATOR ITERATION 1

| | | | |
|---|---|---|---|
| Iteration: 1 | Phase: A | Clock: 1 | obtain bit 0 of $S_0\sigma_0$ initialize $\tau_0$ |
| Iteration: 1 | Phase: A | Clock: 2 | obtain bit 1 of $S_0\sigma_0$ initialize $\tau_0$ |
| Iteration: 1 | Phase: A | Clock: 3 | obtain bit 2 of $S_0\sigma_0$ initialize $\tau_0$ |
| Iteration: 1 | Phase: A | Clock: 4 | obtain bit 3 of $S_0\sigma_0$ initialize $\tau_0$ |
| Iteration: 1 | Phase: A | Clock: 5 | obtain bit 4 of $S_0\sigma_0$ initialize $\tau_0$ |
| Iteration: 1 | Phase: A | Clock: 6 | obtain bit 5 of $S_0\sigma_0$ initialize $\tau_0$ |
| Iteration: 1 | Phase: A | Clock: 7 | obtain bit 6 of $S_0\sigma_0$ initialize $\tau_0$ |
| Iteration: 1 | Phase: A | Clock: 8 | obtain bit 7 of $S_0\sigma_0$ initialize $\tau_0$ $d_n$ available |
| Iteration: 1 | Phase: B | Clock: 1 | update bit 0 of $\sigma_1$ shift syndromes forward one bit |
| Iteration: 1 | Phase: B | Clock: 2 | update bit 1 of $\sigma_1$ shift syndromes forward one bit |
| Iteration: 1 | Phase: B | Clock: 3 | update bit 2 of $\sigma_1$ shift syndromes forward one bit |
| Iteration: 1 | Phase: B | Clock: 4 | update bit 3 of $\sigma_1$ shift syndromes forward one bit |
| Iteration: 1 | Phase: B | Clock: 5 | update bit 4 of $\sigma_1$ shift syndromes forward one bit |
| Iteration: 1 | Phase: B | Clock: 6 | update bit 5 of $\sigma_1$ shift syndromes forward one bit |
| Iteration: 1 | Phase: B | Clock: 7 | update bit 6 of $\sigma_1$ shift syndromes forward one bit |
| Iteration: 1 | Phase: B | Clock: 8 | update bit 7 of $\sigma_1$ shift syndromes forward one bit $d_{n-1}{}^{-1}$ available |

TABLE 2

ERROR LOCATOR ITERATION 2

| | | | |
|---|---|---|---|
| Iteration: 2 | Phase: A | Clock: 1 | obtain bit 0 of $S_0\sigma_1 + S_1\sigma_0$ update $\tau$ |
| Iteration: 2 | Phase: A | Clock: 2 | obtain bit 1 of $S_0\sigma_1 + S_1\sigma_0$ update $\tau$ |
| Iteration: 2 | Phase: A | Clock: 3 | obtain bit 2 of $S_0\sigma_1 + S_1\sigma_0$ update $\tau$ |
| Iteration: 2 | Phase: A | Clock: 4 | obtain bit 3 of $S_0\sigma_1 + S_1\sigma_0$ update $\tau$ |
| Iteration: 2 | Phase: A | Clock: 5 | obtain bit 4 of $S_0\sigma_1 + S_1\sigma_0$ update $\tau$ |
| Iteration: 2 | Phase: A | Clock: 6 | obtain bit 5 of $S_0\sigma_1 + S_1\sigma_0$ update $\tau$ |
| Iteration: 2 | Phase: A | Clock: 7 | obtain bit 6 of $S_0\sigma_1 + S_1\sigma_0$ update $\tau$ |
| Iteration: 2 | Phase: A | Clock: 8 | obtain bit 7 of $S_0\sigma_1 + S_1\sigma_0$ update $\tau$ $d_n$ available |

TABLE 2-continued

ERROR LOCATOR ITERATION 2

| | | | |
|---|---|---|---|
| Iteration: 2 | Phase: B | Clock: 1 | update bit 0 of $\sigma_1$ and $\sigma_2$ shift syndromes forward one bit |
| Iteration: 2 | Phase: B | Clock: 2 | update bit 1 of $\sigma_1$ and $\sigma_2$ shift syndromes forward one bit |
| Iteration: 2 | Phase: B | Clock: 3 | update bit 2 of $\sigma_1$ and $\sigma_2$ shift syndromes forward one bit |
| Iteration: 2 | Phase: B | Clock: 4 | update bit 3 of $\sigma_1$ and $\sigma_2$ shift syndromes forward one bit |
| Iteration: 2 | Phase: B | Clock: 5 | update bit 4 of $\sigma_1$ and $\sigma_2$ shift syndromes forward one bit |
| Iteration: 2 | Phase: B | Clock: 6 | update bit 5 of $\sigma_1$ and $\sigma_2$ shift syndromes forward one bit |
| Iteration: 2 | Phase: B | Clock: 7 | update bit 6 of $\sigma_1$ and $\sigma_2$ shift syndromes forward one bit |
| Iteration: 2 | Phase: B | Clock: 8 | update bit 7 of $\sigma_1$ and $\sigma_2$ shift syndromes forward one bit $d_{n-1}^{-1}$ available |

TABLE 3

ERROR LOCATOR ITERATION 8

| | | | |
|---|---|---|---|
| Iteration: 8 | Phase: A | Clock: 1 | obtain bit 0 of $S_0\sigma_7 + S_1\sigma_6 \ldots + S_7\sigma_0$ update $\tau$, shift syndromes backward |
| Iteration: 8 | Phase: A | Clock: 2 | obtain bit 1 of $S_0\sigma_1 + S_1\sigma_0$ $S_0\sigma_7 + S_1\sigma_6 \ldots + S_7\sigma_0$ update $\tau$, shift syndromes backward |
| Iteration: 8 | Phase: A | Clock: 3 | obtain bit 2 of $S_0\sigma_1 + S_1\sigma_0$ $S_0\sigma_7 + S_1\sigma_6 \ldots + S_7\sigma_0$ update $\tau$, shift syndromes backward |
| Iteration: 8 | Phase: A | Clock: 4 | obtain bit 3 of $S_0\sigma_1 + S_1\sigma_0$ $S_0\sigma_7 + S_1\sigma_6 \ldots + S_7\sigma_0$ update $\tau$, shift syndromes backward |
| Iteration: 8 | Phase: A | Clock: 5 | obtain bit 4 of $S_0\sigma_1 + S_1\sigma_0$ $S_0\sigma_7 + S_1\sigma_6 \ldots + S_7\sigma_0$ update $\tau$, shift syndromes backward |
| Iteration: 8 | Phase: A | Clock: 6 | obtain bit 5 of $S_0\sigma_1 + S_1\sigma_0$ $S_0\sigma_7 + S_1\sigma_6 \ldots + S_7\sigma_0$ update $\tau$, shift syndromes backward |
| Iteration: 8 | Phase: A | Clock: 7 | obtain bit 6 of $S_0\sigma_1 + S_1\sigma_0$ $S_0\sigma_7 + S_1\sigma_6 \ldots + S_7\sigma_0$ update $\tau$, shift syndromes backward |
| Iteration: 8 | Phase: A | Clock: 8 | obtain bit 7 of $S_0\sigma_1 + S_1\sigma_0$ $S_0\sigma_7 + S_1\sigma_6 \ldots + S_7\sigma_0$ update $\tau$, shift syndromes backward $d_n$ available |
| Iteration: 8 | Phase: B | Clock: 1 | update bit 0 of $\sigma_1, \sigma_2 \ldots \sigma_8$ shift syndromes backward one bit |
| Iteration: 8 | Phase: B | Clock: 2 | update bit 1 of $\sigma_1, \sigma_2 \ldots \sigma_8$ shift syndromes backward one bit |
| Iteration: 8 | Phase: B | Clock: 3 | update bit 2 of $\sigma_1, \sigma_2 \ldots \sigma_8$ shift syndromes backward one bit |
| Iteration: 8 | Phase: B | Clock: 4 | update bit 3 of $\sigma_1, \sigma_2 \ldots \sigma_8$ shift syndromes backward one bit |
| Iteration: 8 | Phase: B | Clock: 5 | update bit 4 of $\sigma_1, \sigma_2 \ldots \sigma_8$ shift syndromes backward one bit |
| Iteration: 8 | Phase: B | Clock: 6 | update bit 5 of $\sigma_1, \sigma_2 \ldots \sigma_8$ shift syndromes backward one bit |

TABLE 3-continued

ERROR LOCATOR ITERATION 8

| | | | |
|---|---|---|---|
| Iteration: 8 | Phase: B | Clock: 7 | update bit 6 of $\sigma_1, \sigma_2 \ldots \sigma_8$ shift syndromes backward one bit |
| Iteration: 8 | Phase: B | Clock: 8 | update bit 7 of $\sigma_1, \sigma_2 \ldots \sigma_8$ shift syndromes backward one bit |

The embodiments of the invention in which an exclusive property or privilege is claimed are defined as follows:

1. A decoder for generating electrical signals indicative of coefficients of an error locator polynomial for a codeword by conducting a plurality of error locator iterations, each error locator iteration having two phases, wherein the decoder comprises:

first circuit means for updating, during the first phase of each iteration, electrical signals stored in a bank of intermediate registers, the electrical signals stored in the bank of intermediate registers representing values of updated coefficients of an intermediate polynomial $\tau^n(x)$, said first circuit means utilizing:

electrical signals representing an inverse of a prior discrepancy $d_{(n-1)}^{-1}$ generated during a directly preceding error locator iteration, and electrical signals representing values of updated coefficients of the error locator polynomial $\sigma^n(x)$ as updated during the directly preceding error locator iteration for all error locator iterations after a first error locator iteration;

second circuit means for generating, during the first phase of each error locator iteration, electrical signals representing a current discrepancy $d_n$, the second circuit means utilizing the electrical signals representing coefficients of the error locator polynomial $\sigma^n(x)$ as updated during the directly preceding error locator iteration for all error locator iterations after the first error locator iteration;

an inversion circuit for generating electrical signals representing an inverse $d_n^{-1}$ of the current discrepancy during an error locator iteration, which inverse $d_n^{-1}$ becomes the inverse of the prior discrepancy $d_{n-1}^{-1}$ during a directly succeeding error locator iteration; and third circuit means connected to said first and said second circuit means for generating, during the second phase of each error locator iteration, electrical signals representing coefficients of the error locator polynomial $\sigma^{n+1}(x)$, the third circuit means utilizing:

the electrical signals representing the coefficients of the error locator polynomial $\sigma^n(x)$ as updated during the directly preceding error locator iteration, the electrical signals representing the current discrepancy $d_n$, and the electrical signals representing the coefficients of the intermediate polynomial $\tau^n(x)$ as updated during the first phase;

whereby, at the conclusion of a final error locator iteration for the codeword, electrical signals representing final values for the coefficients of the error locator polynomial are stored in the bank of error locator registers.

2. An error decoder which executes a plurality of iterations including at least a first iteration and a second iteration of a Reed-Solomon decoding procedure to obtain coefficients of an error locator polynomial, each iteration including a first phase and a second phase, the decoder comprising:

a bank of syndrome registers for storing syndrome values at least during the first phase of each iteration;

a bank of error locator registers for accumulating therein, during the second phase of the second iteration, updated values for coefficients of the error locator polynomial, the bank of error locator registers having stored therein, during the first phase of the second iteration, values for the coefficients obtained during the second phase of the first iteration;

a bank of intermediate registers for accumulating therein, during the first phase of the second iteration, updated values for coefficients of an intermediate polynomial and for storing the updated values for the coefficients of the intermediate polynomial during the second phase of the second iteration;

a register update circuit which, during the first phase of the second iteration, accumulates the updated values for the coefficients of the intermediate polynomial in the bank of intermediate registers and which, during the second phase of the second iteration, accumulates the updated values for the coefficients of the error locator polynomial in the bank of error locator registers.

3. The decoder of claim 2, wherein the syndrome values are stored in a alpha basis representation in the bank of syndrome registers, wherein the coefficients of the error locator polynomial are accumulated/stored in a beta basis representation in the bank of error locator registers, and wherein the coefficients of the intermediate polynomial are accumulated/stored in a beta basis representation in the bank of intermediate registers.

4. The decoder of claim 2, wherein the bank of syndrome registers comprises a plurality of syndrome registers, the bank of error locator registers comprises a plurality of error locator registers, and the bank of intermediate registers comprises a plurality of intermediate registers, each syndrome register being paired with one of the error locator registers to form a syndrome/locator register pair and each intermediate register being paired with one of the error locator registers to form an intermediate/locator register pair; and wherein the register update circuit further comprises:

a discrepancy determination circuit which adds multiplicative products to obtain a discrepancy value $d_{n-1}$ during a first phase of a $n-1^{th}$ iteration and a discrepancy value $d_n$ during a first phase of a $n^{th}$ iteration, each multiplicative product being derived from values in a corresponding syndrome/locator register pair; and a discrepancy inversion circuit for determining $d_{n-1}^{-1}$ during the $n-1^{th}$ iteration.

5. The decoder of claim 4, wherein the discrepancy inversion circuit for determining $d_{n-1}^{-1}$ determines $d_{n-1}^{-1}$ in the alpha basis representation, and wherein the register update circuit further comprises:

a conversion circuit for converting $d_n$ from a beta basis representation to a alpha basis representation;

a discrepancy register for selectively storing one of $d_n$ in the alpha basis representation and $d_{n-1}^{-1}$ in the alpha basis representation; and, a multiplier feedback circuit connected to the discrepancy register for repetitively multiplying the value in the discrepancy register by a constant.

6. The decoder of claim 5, wherein the discrepancy register selectively stores an electrical signal corresponding to an erasure pointer value.

7. The decoder of claim 4, wherein, during the first phase of the $n^{th}$ iteration, the register update circuit optionally utilizes $d_{n-1}^{-1}$ and the values then stored in the bank of error locator register for accumulating the updated values for the intermediate registers.

8. The decoder of claim 4, wherein, during the second phase of the $n^{th}$ iteration, the register update circuit accumulates the updated values for the coefficients of the error locator polynomial by using the discrepancy value $d_n$ and values then stored in the bank of intermediate registers.

9. The decoder of claim 4, wherein each multiplicative product is a product of a value in a first of the registers in the syndrome/locator register pair and a multiple of a value in a second of the registers in the syndrome/locator register pair.

10. The decoder of claim 9, wherein the first of the registers is an error locator register of the syndrome/locator register pair and the second of the registers is a syndrome register of the syndrome/locator register pair.

11. The decoder of claim 10, further comprising:

a bank of modified syndrome registers comprising a plurality of syndrome registers connected in paired relationship to a corresponding syndrome register in the bank of syndrome registers, each modified syndrome register being connected to receive a syndrome value from the corresponding syndrome register with which the modified syndrome register is in paired relationship; and a multiplier feedback circuit connected to each modified syndrome register for repetitively multiplying the value in the modified syndrome register by a constant for use in obtaining the multiplicative product.

12. The decoder of claim 9, wherein each multiplicative product is a product of a value in a first of the registers in the syndrome/locator register pair and an $\alpha$ multiple of a value in a second of the registers in the syndrome/locator register pair.

13. The decoder of claim 4, wherein the syndrome values are stored in a alpha basis representation in the bank of syndrome registers, wherein the coefficients of the error locator polynomial are accumulated/stored in a beta basis representation in the bank of error locator registers, and wherein the coefficients of the intermediate polynomial are accumulated/stored in a beta basis representation in the bank of intermediate registers.

14. The decoder of claim 2, wherein there is only one bank of error locator registers for storing the coefficients of the error locator polynomial and only one bank of intermediate registers for storing the coefficients of the intermediate polynomial.

15. A Reed-Solomon decoder comprising:

a bank of syndrome registers for storing syndrome values;

a bank of error locator registers for accumulating therein coefficients of an error locator polynomial;

a bank of intermediate registers for accumulating therein coefficients of an intermediate polynomial;

an iterative register update circuit comprising:

a discrepancy determination circuit which adds multiplicative products to obtain a current discrepancy $d_n$ during an $n^{th}$ iteration, each multiplicative product being derived from values stored in paired ones of the syndrome registers and the error locator registers;

a discrepancy inversion circuit which determines an inverse $d_n{}^{-1}$ of the discrepancy;

an updating multiplier circuit which, during the $n^{th}$ iteration, selectively multiplies a value derived from an inverse $d_{n-1}{}^{-1}$ of the discrepancy of a prior iteration $n-1$ by the coefficients in the error locator register to obtain values for use in updating the coefficients stored in the intermediate registers and which, after the intermediate registers are updated, multiplies a value derived from the current discrepancy $d_n$ by the coefficients in the intermediate registers to obtain values for updating the coefficients stored in the error locator registers.

16. The decoder of claim 15, wherein the syndrome values are stored in a alpha basis representation in the bank of syndrome registers, wherein the coefficients of the error locator polynomial are accumulated in a beta basis representation in the bank of error locator registers, and wherein the coefficients of the intermediate polynomial are accumulated in a beta basis representation in the bank of intermediate registers.

17. The decoder of claim 15, wherein the discrepancy inversion circuit which determines the inverse of the discrepancy determines the inverse of the discrepancy in the alpha basis representation.

18. The decoder of claim 15, wherein the register update circuit further comprises a conversion circuit for converting $d_n$ from a beta basis representation to a alpha basis representation.

19. The decoder of claim 18, wherein the register update circuit further comprises:

a discrepancy register for selectively storing one of the discrepancy in the alpha basis representation and the inverse of the discrepancy in the alpha basis representation; and, a multiplier feedback circuit connected to the discrepancy register for repetitively multiplying the value in the discrepancy register by a constant.

20. The decoder of claim 15, wherein each multiplicative product is a product of a value in a first of the registers in a syndrome/locator register pair and a multiple of a value in a second of the registers in the syndrome/locator register pair.

21. The decoder of claim 20, wherein the first of the registers is an error locator register of the syndrome/locator register pair and the second of the registers is a syndrome register of the syndrome/locator register pair.

22. The decoder of claim 21, further comprising:

a bank of modified syndrome registers comprising a plurality of syndrome registers connected in paired relationship to a corresponding syndrome register in the bank of syndrome registers, each modified syndromes register being connected to receive a syndrome value from the corresponding syndrome register with which the modified syndrome register is in paired relationship; and a multiplier feedback circuit connected to each modified syndrome register for repetitively multiplying the value in the modified syndrome register by a constant for use in obtaining the multiplicative product.

23. The decoder of claim 15, wherein each multiplicative product is a product of a value in a first of the registers in the syndrome/locator register pair and an $\alpha$ multiple of a value in a second of the registers in the syndrome/locator register pair.

24. The decoder of claim 15, wherein there is only one bank of error locator registers for storing the coefficients of the error locator polynomial and only one bank of intermediate registers for storing the coefficients of the intermediate polynomial.

25. The decoder of claim 15, wherein the multiplier selectively multiplies either the coefficients in the error locator registers or the coefficients in the intermediate registers by a selected one of the discrepancy or the inverse of the discrepancy.

26. A slice of an error correction circuit for a Reed-Solomon decoder, the slice comprising:

an error locator register for storing therein a coefficient for an error locator polynomial;

an intermediate register for storing therein a coefficient for an intermediate polynomial;

an updating multiplier circuit which selectively multiplies the coefficient in the error locator register by a first input value to obtain a coefficient for inputting to a first neighboring slice and which, after the intermediate register is updated with a coefficient from a second neighboring slice, multiplies a second input value by the coefficient in the intermediate register to obtain a value for updating the coefficient stored in the error locator register.

27. The slice of claim 26, wherein the coefficient of the error locator polynomial is stored in a beta basis representation in the error locator register, and wherein the coefficient of the intermediate polynomial is stored in a beta basis representation in the intermediate register.

28. The slice of claim 26, further comprising:

a syndrome register;

a discrepancy-yielding multiplier which multiplies terms derived from values stored in the syndrome register and the error locator register.

29. The slice of claim 28, wherein the discrepancy-yielding multiplier multiplies a value in the error locator register and a multiple of a value in the syndrome register.

30. The slice of claim 29, further comprising:

a modified syndrome register connected to receive a syndrome value from the syndrome register; and a multiplier feedback circuit connected to the modified syndrome register for repetitively multiplying the value in the modified syndrome register by a constant, an output of the modified syndrome register being connected to the discrepancy-yielding multiplier.

31. The slice of claim 28, wherein an output of the discrepancy-yielding multiplier is a product of a value in a first of the registers in the slice and an $\alpha$ multiple of a value in a second of the registers in the slice.

32. The slice of claim 26, wherein the second input value is a discrepancy value and the first input value is an inverse of the discrepancy value.

33. The slice of claim 32, wherein the discrepancy value and the inverse of the discrepancy value are in the alpha basis representation.

34. The slice of claim 26, wherein there is only one error locator register in the slice for storing the coefficient of the error locator polynomial and only one intermediate register in the slice for storing the coefficient of the intermediate polynomial.

35. The slice of claim 26, wherein the updating multiplier selectively multiplies either the coefficient in the error locator register or the coefficient in the intermediate register by a selected one of a discrepancy value or an inverse of the discrepancy value.

36. A method of obtaining an error locator polynomial as part of decoding a Reed-Solomon codeword during a plurality of iterations of a decoder circuit, including at least a prior iteration and a current iteration, each iteration including a first phase and a second phase, the method comprising:
- loading syndrome values into a bank of syndrome registers and storing the syndrome values in the syndrome registers at least during the first phase of each iteration;
- storing in a bank of error locator registers, during the first phase of a current iteration, values for coefficients of the error locator polynomial accumulated during a prior iteration;
- using, during the first phase of a current iteration, the values for the coefficients of the error locator polynomial stored in the bank of error locator registers during the first phase of the current iteration to accumulate updated values for coefficients of an intermediate polynomial, the coefficients of the intermediate polynomial being stored in a bank of intermediate registers;
- using, during the second phase of the current iteration, the coefficients of the intermediate polynomial then stored in the bank of intermediate registers to accumulate updated values for the coefficients of the error locator polynomial in the error locator registers.

37. A method of obtaining an error locator polynomial as part of decoding an m-bit Reed-Solomon codeword during m number of iterations of a decoder circuit, including at least a prior iteration and a current iteration, each iteration including a first phase and a second phase, the method comprising:
- loading m-bit electrical signals indicative of syndrome values into a bank of syndrome registers and storing the syndrome-indicative electrical signals in the syndrome registers at least during the first phase of each iteration;
- storing in a bank of error locator registers, during the first phase of a current iteration, electrical signals corresponding to values for coefficients of the error locator polynomial accumulated during a prior iteration;
- using, during the first phase of a current iteration, the electrical signals corresponding to values for the coefficients of the error locator polynomial stored in the bank of error locator registers during the first phase of the current iteration to generate electrical signals corresponding to accumulated updated values for coefficients of an intermediate polynomial, the electrical signals corresponding to coefficients of the intermediate polynomial being stored in a bank of intermediate registers;
- using, during the second phase of the current iteration, the electrical signals corresponding to the coefficients of the intermediate polynomial then stored in the bank of intermediate registers to generate electrical signals corresponding to accumulated updated values for the coefficients of the error locator polynomial in the error locator registers;
- using the electrical signals corresponding to accumulated updated values for the coefficients of the error locator polynomial in the error locator registers for correcting the codeword.

* * * * *